United States Patent
Chen et al.

(10) Patent No.: US 12,132,094 B2
(45) Date of Patent: Oct. 29, 2024

(54) SEMICONDUCTOR DEVICE INCLUDING STRAINED TRANSISTOR AND METHOD FOR MANUFACTURING THE SAME

(71) Applicant: TAIWAN SEMICONDUCTOR MANUFACTURING COMPANY, LTD., Hsinchu (TW)

(72) Inventors: Te-An Chen, Hsinchu (TW); Meng-Han Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 588 days.

(21) Appl. No.: 17/313,428

(22) Filed: May 6, 2021

(65) Prior Publication Data
US 2022/0359715 A1 Nov. 10, 2022

(51) Int. Cl.
*H01L 29/66* (2006.01)
*H01L 29/16* (2006.01)
*H01L 29/423* (2006.01)

(52) U.S. Cl.
CPC ........ *H01L 29/66545* (2013.01); *H01L 29/16* (2013.01); *H01L 29/4236* (2013.01); *H01L 29/66484* (2013.01)

(58) Field of Classification Search
CPC ......... H01L 29/66545; H01L 29/66484; H01L 29/4236; H01L 29/16
USPC .......................................................... 257/288
See application file for complete search history.

(56) References Cited

U.S. PATENT DOCUMENTS 11,769,769 B2 * 9/2023 Jun ...................... H01L 29/0847
257/288
2020/0343363 A1 * 10/2020 Lin ...................... H01L 29/7848

* cited by examiner

*Primary Examiner* — Monica D Harrison
(74) *Attorney, Agent, or Firm* — Birch, Stewart, Kolasch & Birch, LLP

(57) ABSTRACT

A method for manufacturing a semiconductor device includes forming a first CPODE dummy poly gate and a second CPODE dummy poly gate on a semiconductor substrate; removing the first CPODE dummy poly gate and a portion of the semiconductor substrate therebelow to form a first trench extending into the semiconductor substrate; filling the first trench with a first dielectric material to form a first isolation structure to isolate the first and second transistors from each other; removing the second CPODE dummy poly gate and a portion of the semiconductor substrate therebelow to form a second trench extending into the semiconductor substrate; and filling the second trench with a second dielectric material having a dielectric composition different from that of the first dielectric material to form a second isolation structure to isolated the third and fourth transistors from each other.

20 Claims, 22 Drawing Sheets

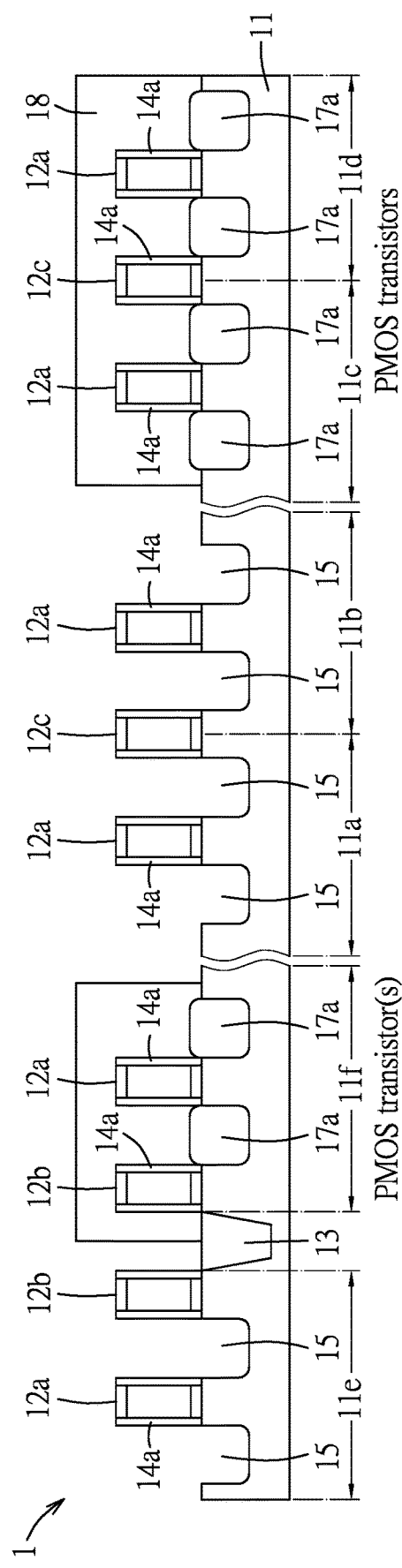
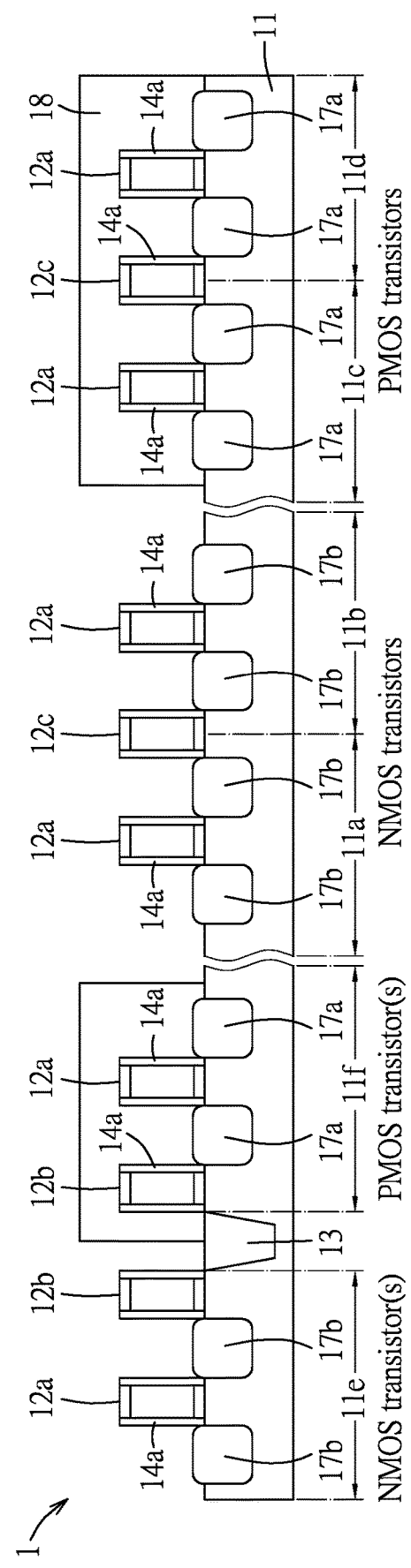
FIG. 8
FIG. 9

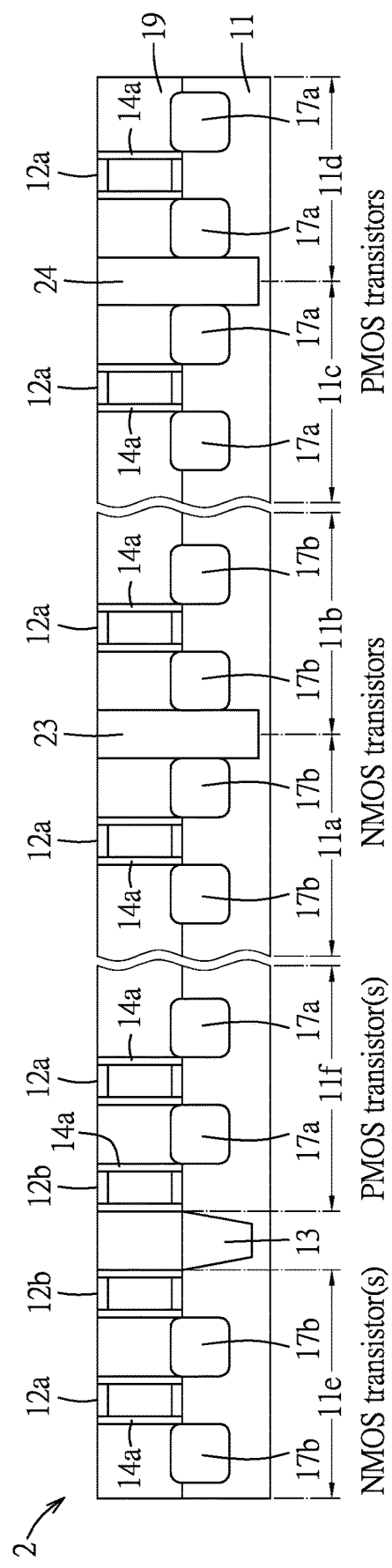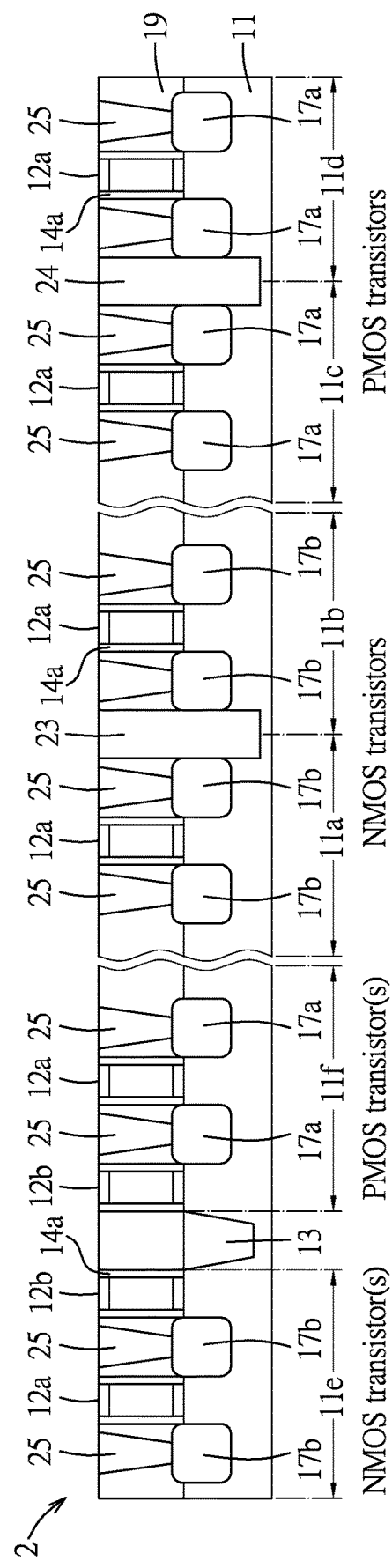

SEMICONDUCTOR DEVICE INCLUDING STRAINED TRANSISTOR AND METHOD FOR MANUFACTURING THE SAME

BACKGROUND

When a semiconductor device such as a metal-oxide-semiconductor field-effect transistor (MOSFET) is scaled down, device packing density and device performance are challenged by device layout and isolation. In order to avoid leakage between neighboring devices, the standard device layout adopts dummy polycrystalline silicon (poly) segments formed on edges of an oxide definition (OD) region such as an active region of a standard cell. A poly-on-OD-edge (PODE) pattern or a continuous or connected poly-on-OD-edge (CPODE) pattern is used to form the dummy poly segments.

In addition, mechanical stresses are known to play a role in carrier mobility in the MOSFET. One way to develop the mechanical stresses in the MOSFET is to use a dielectric material to form an isolation structure which is disposed as a PODE or CPODE structure to separate two neighboring cells (MOSFET devices).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 14 illustrate schematic views showing intermediate stages of the method depicted in FIG. 1.

FIGS. 17 to 32 illustrate schematic views showing intermediate stages of the method depicted in FIGS. 16A and 16B.

FIG. 33 illustrates a schematic view showing an additional stage for further processing the semiconductor device manufactured in accordance with some embodiments

DETAILED DESCRIPTION

Figure 1:
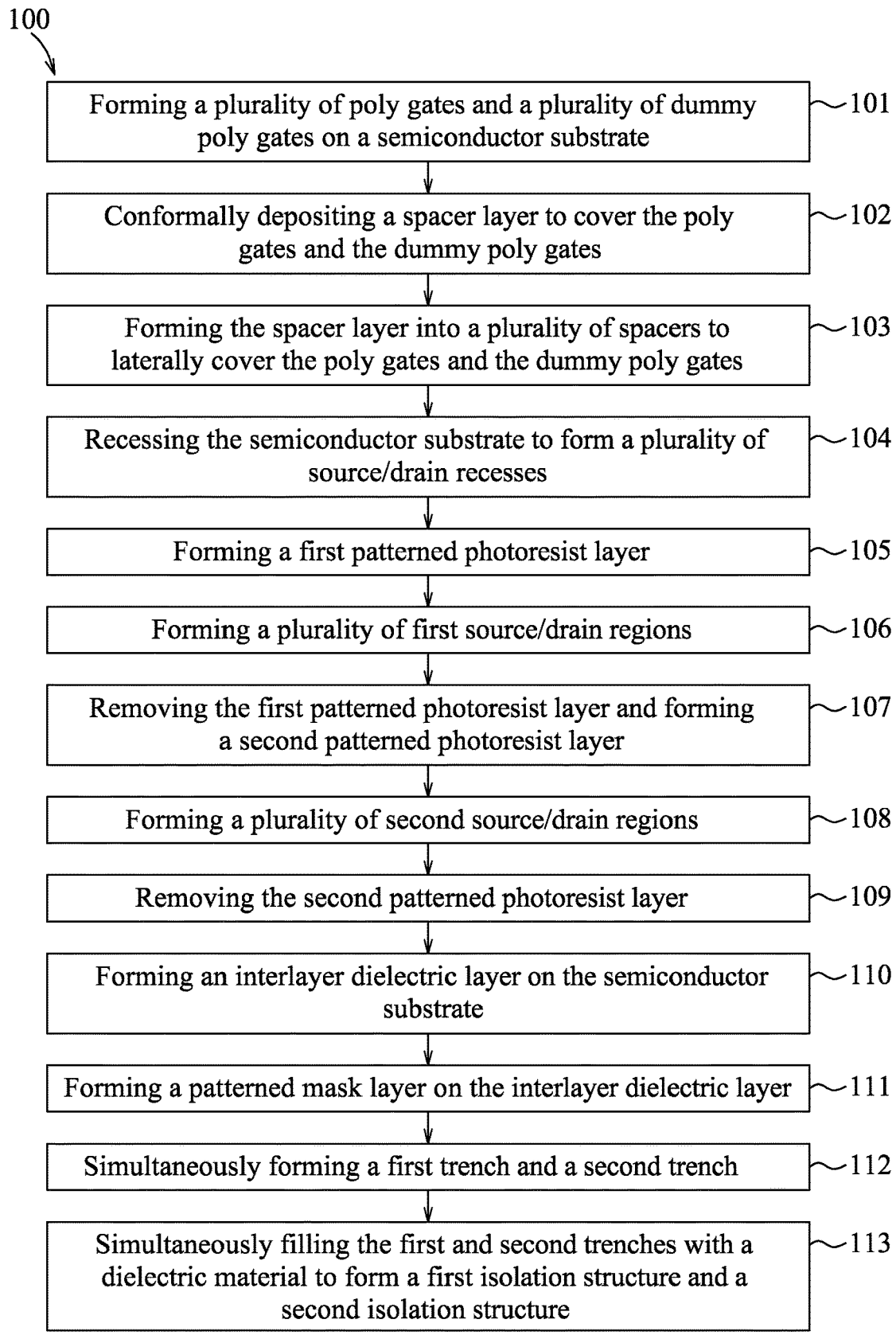
FIG. 1 is a flow diagram illustrating a method for manufacturing a semiconductor device including strained transistors in accordance with some embodiments.
Figure 2:
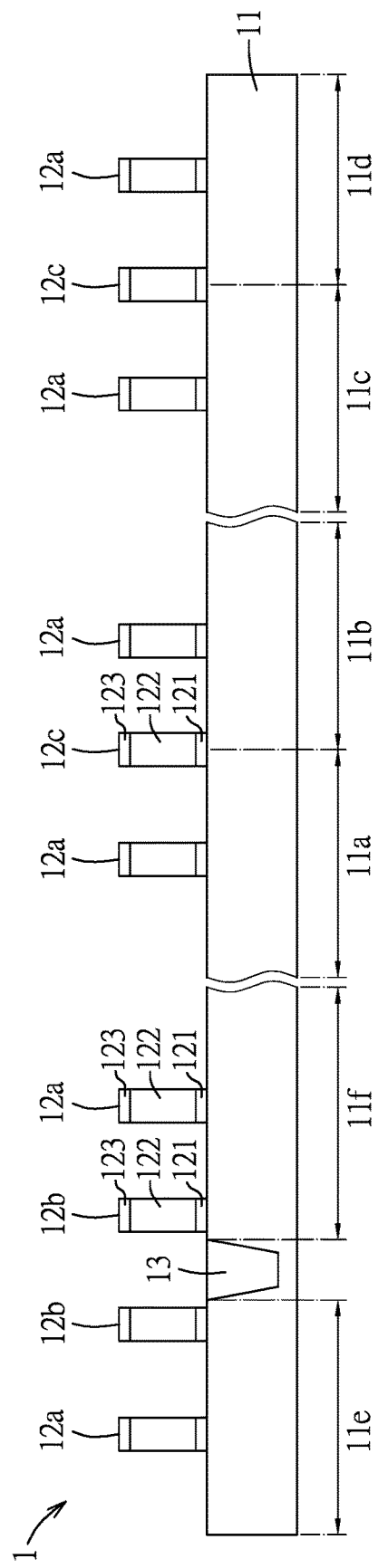
Figure 3:
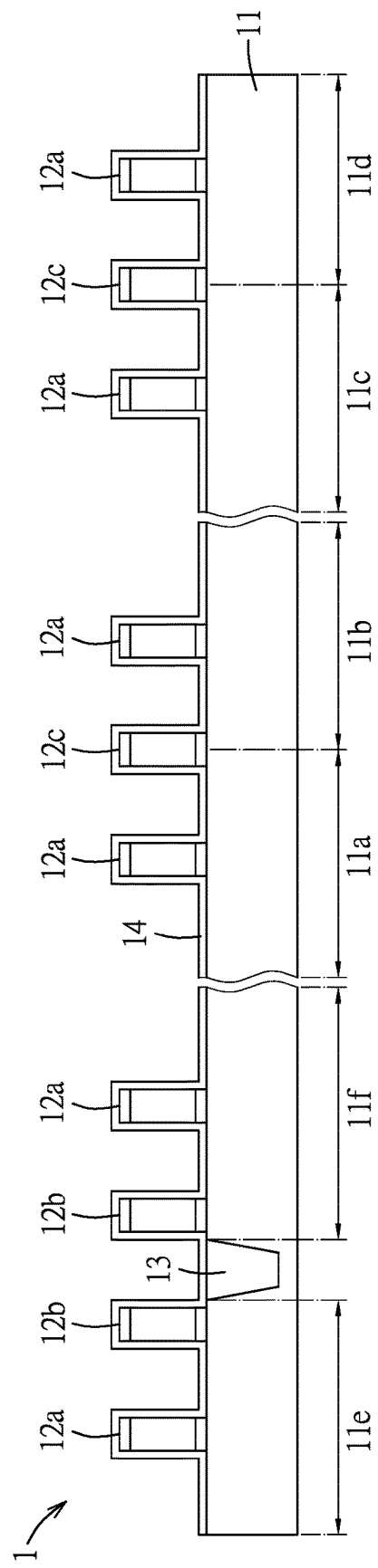
Figure 4:
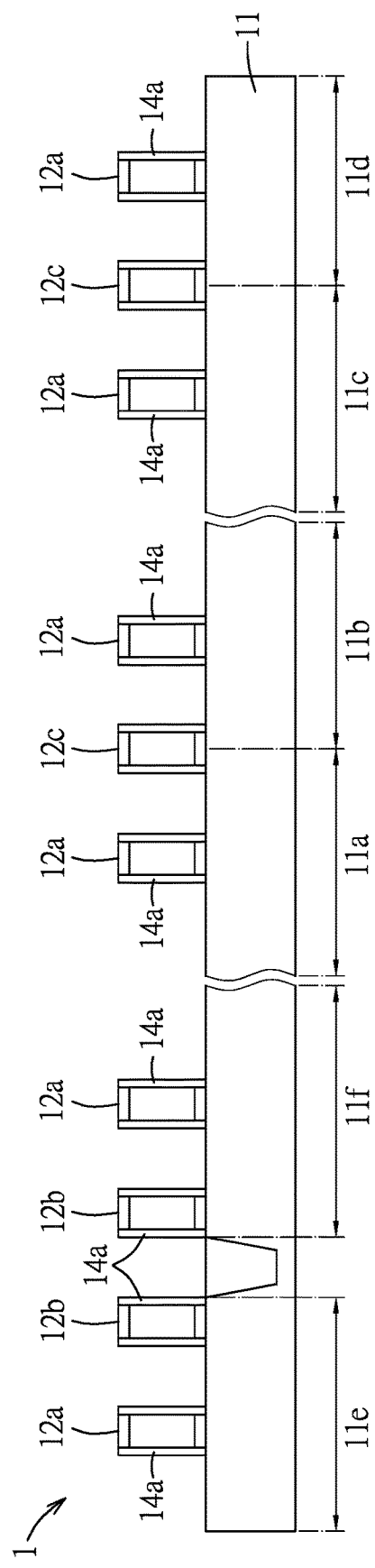
Figure 5:
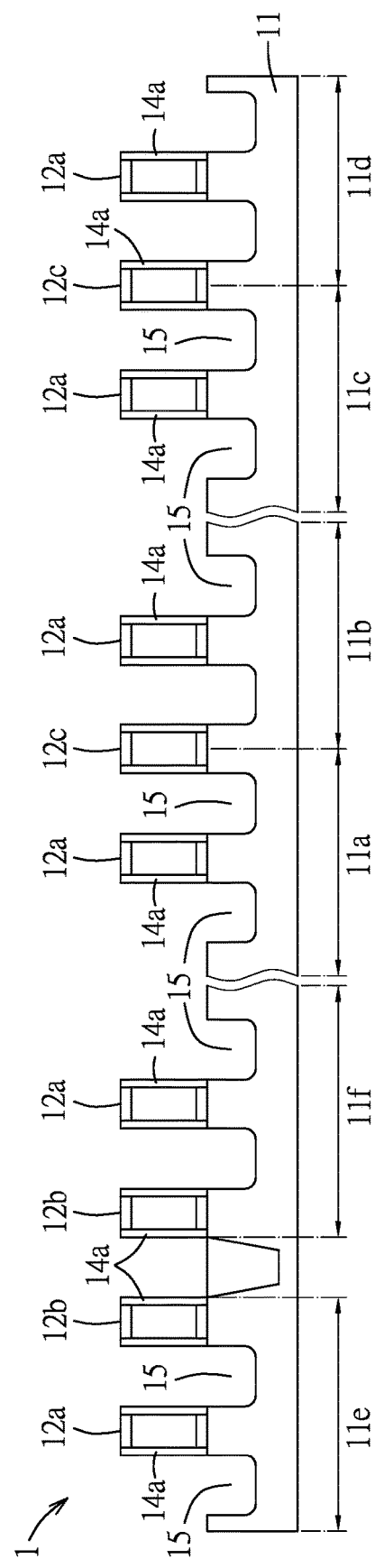
Figure 6:
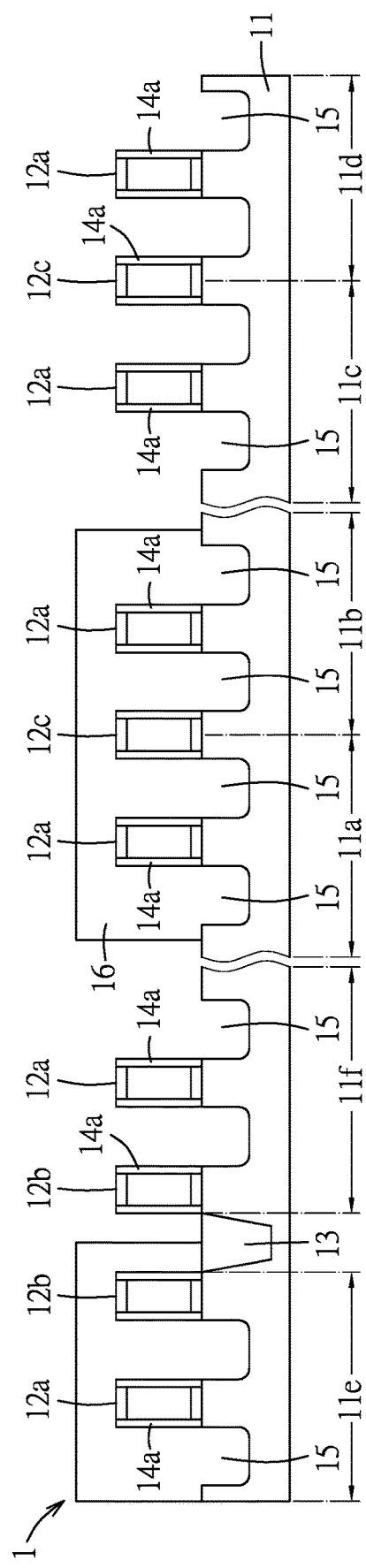
Figure 7:
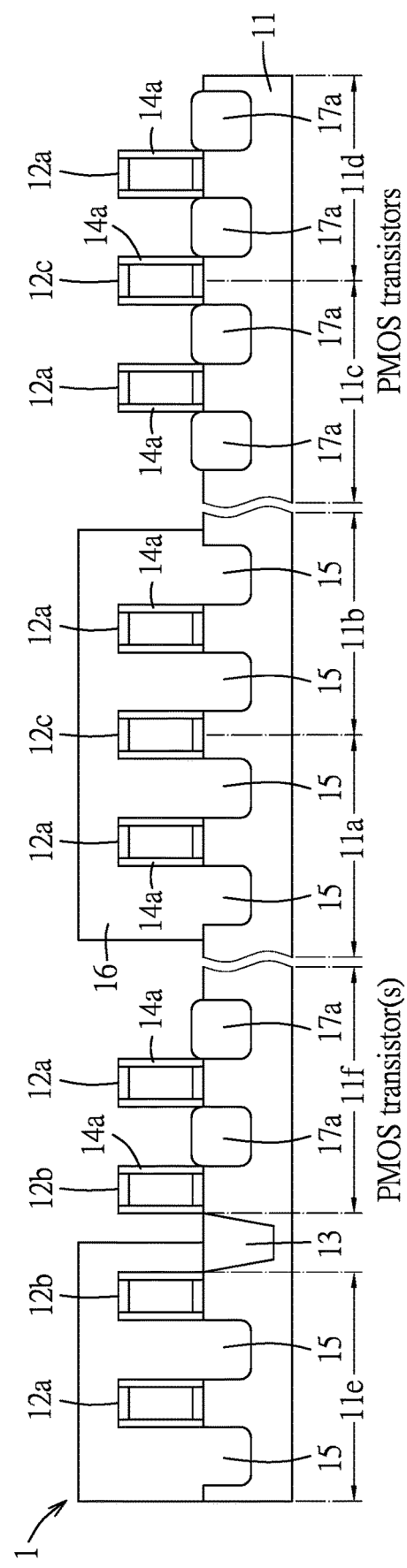
Figure 10:
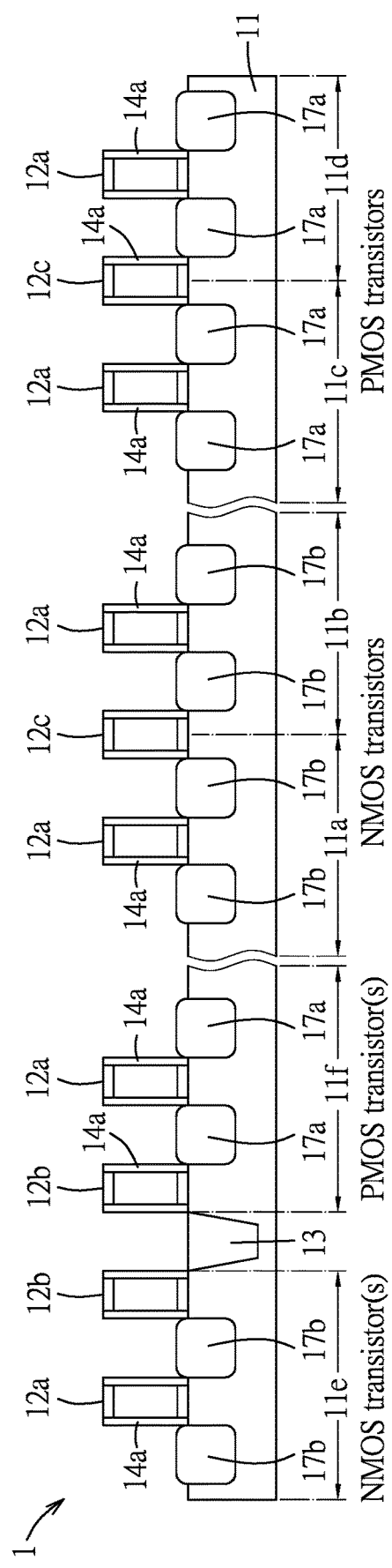
Figure 11:
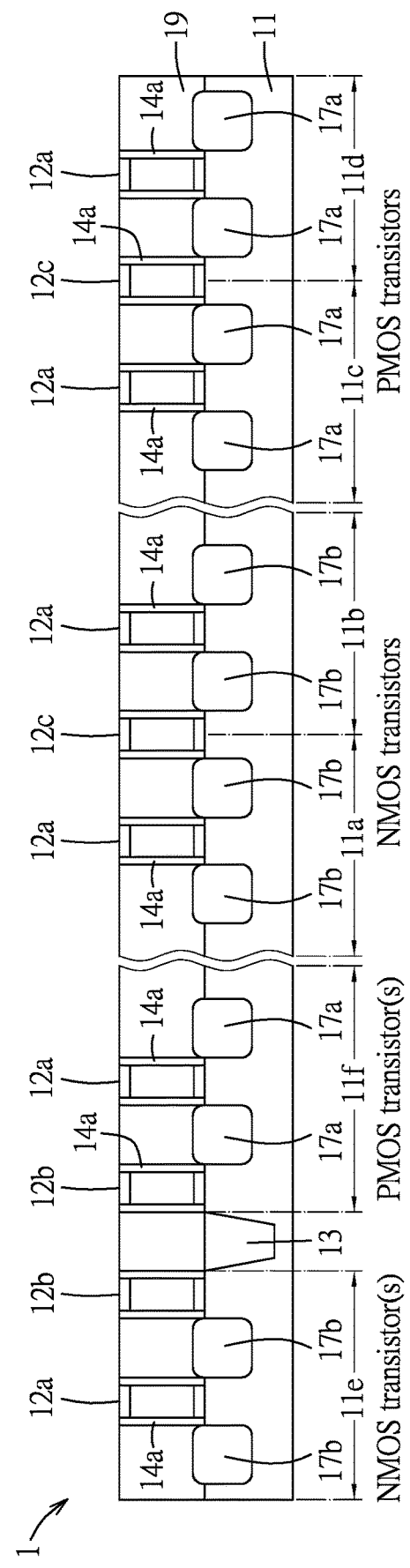
Figure 12:
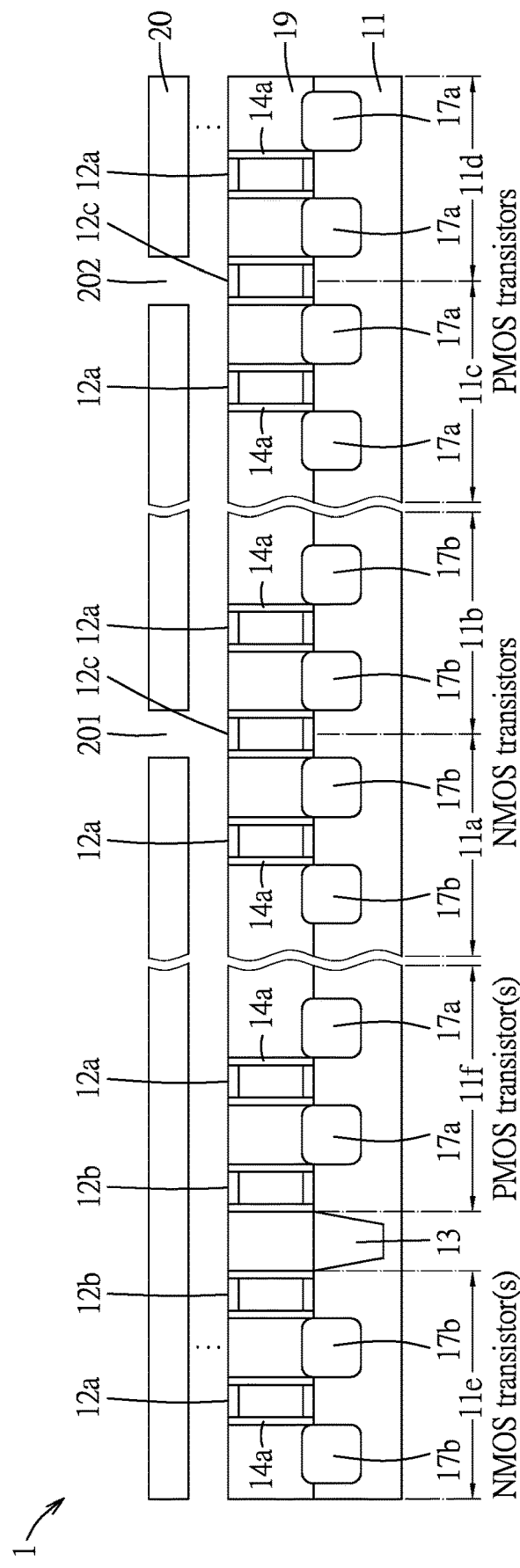
Figure 13:
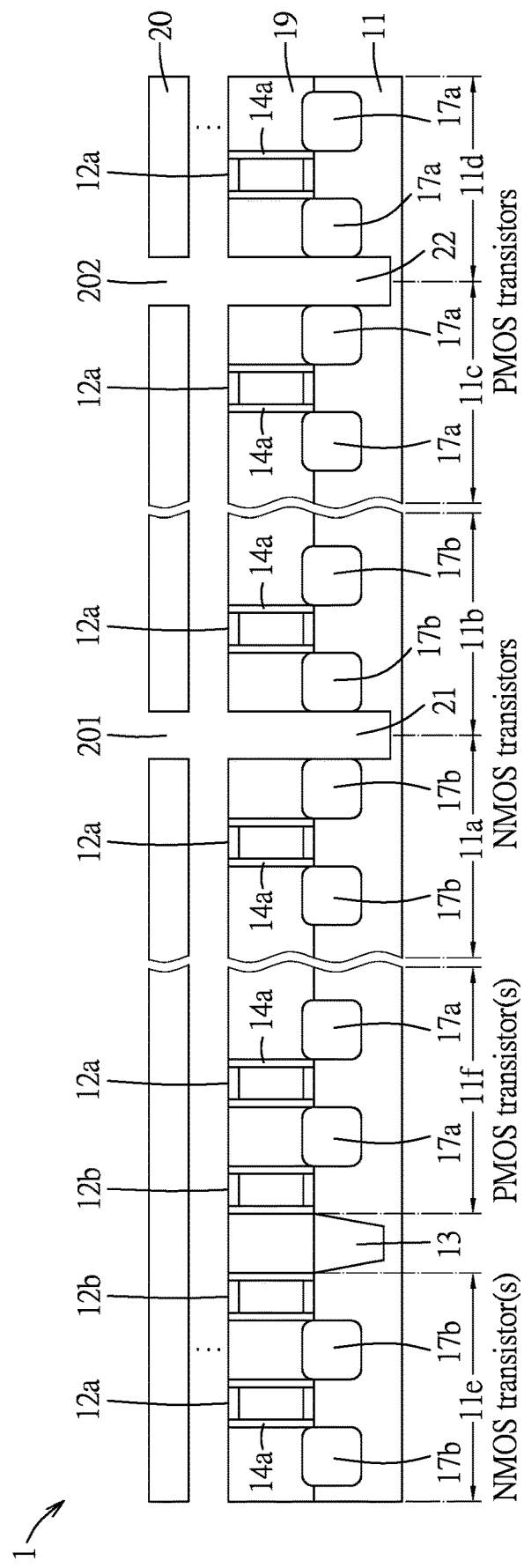
Figure 14:
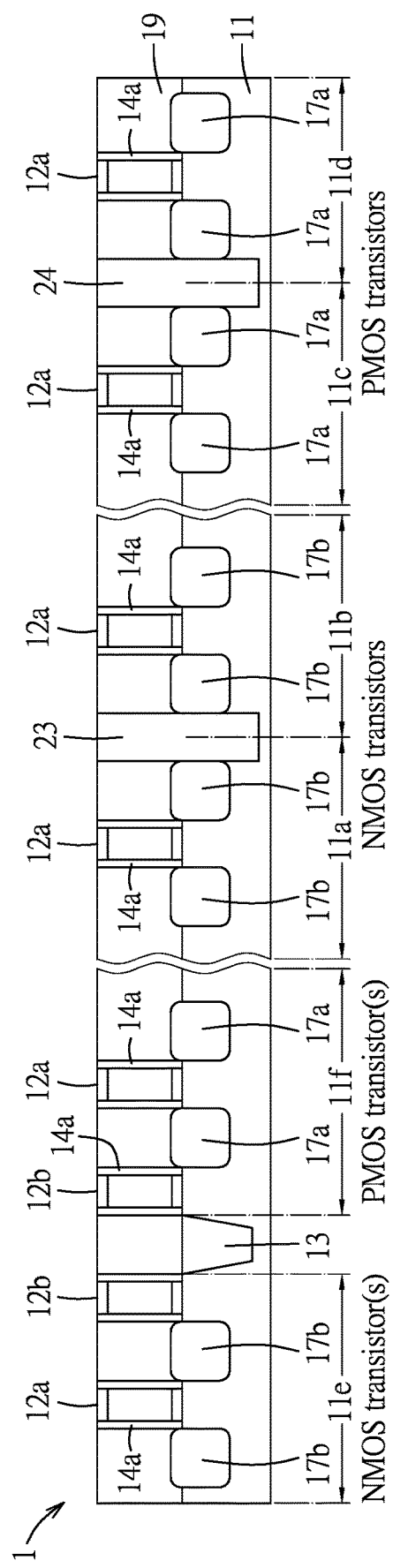

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor device including strained transistors in accordance with some embodiments. FIGS. 2 to 14 illustrate schematic views showing a semiconductor device 1 during various stages of the method 100 of FIG. 1. The method 100 and the semiconductor device 1 are collectively described below. However, additional steps can be provided before, after or during the method 100, and some of the steps described herein may be replaced by other steps or be eliminated. Similarly, further additional features may be present in the semiconductor device 1, and/or features present may be replaced or eliminated in additional embodiments.

Referring to FIG. 1, the method 100 begins at block 101, where a plurality of poly gates and a plurality of dummy poly gates are formed on a semiconductor substrate. Referring to the example illustrated in FIG. 2, a plurality of poly gates 12a and a plurality of dummy poly gates 12b, 12c are formed on a semiconductor substrate 11. The semiconductor substrate 11 includes a first oxide definition (OD) region 11a, a second OD region 11b, a third OD region 11c, a fourth OD region 11d, a fifth OD region 11e, and a sixth OD region 11f. One of the dummy poly gates 12c is on a common edge of the first and second OD regions 11a, 11b, and is referred to herein as a CPODE dummy poly gate. Another of the dummy poly gates 12c is on a common edge of the third and fourth OD regions 11c, 11d, and is referred to herein as a CPODE dummy poly gate. Two of the dummy poly gates 12b are respectively on two adjacent edges of the fifth OD region 11e and the sixth OD region 11f, and are referred to herein as PODE dummy poly gates. In some embodiments, the semiconductor substrate 11 may be, for example but not limited to, a part of a wafer, a silicon substrate, a silicon carbon substrate, or a substrate made of another semiconductor material. In some embodiments, the semiconductor substrate 11 may be non-doped or lightly-doped with a P-type or an N-type impurity. A shallow trench isolation (STI) 13 is formed in the semiconductor substrate 11 and between the two of the dummy poly gates 12b. In some embodiments, the STI 13 may be formed by etching a shallow trench in the semiconductor substrate 11, and filling the shallow trench with a dielectric material such as silicon oxide.

Each of the poly gates 12a and the dummy poly gates 12b, 12c includes a gate dielectric layer 121 disposed on the semiconductor substrate 11, a polysilicon layer 122 disposed on the gate dielectric layer 121, and a hard mask layer 123 disposed on the polysilicon layer 122. In some embodiments, the poly gates 12a and the dummy poly gates 12b, 12c may be formed by the following process.

Layers of a gate dielectric material, a polysilicon material, and a hard mask material are formed sequentially on the semiconductor substrate 11. The layer of the gate dielectric material is formed by a suitable process as known to those skilled in the art of semiconductor fabrication, for example but not limited to, chemical vapor deposition (CVD), atomic layer deposition (ALD), high density plasma CVD (HDPCVD), remote plasma CVD (RPCVD), plasma enhanced CVD (PECVD), or other suitable methods. In some embodiments, the gate dielectric material may include, for example but not limited to, silicon oxide, silicon oxynitride, silicon nitride, or combinations thereof. The layer of the polysilicon material is formed by a suitable process as known to those skilled in the art of semiconductor fabrication, for example but not limited to, CVD, ALD, HDPCVD, RPCVD, PECVD, or other suitable methods. The layer of the hard mask material is formed by a suitable process as known to those skilled in the art of semiconductor fabrication, for example but not limited to, CVD, ALD, spin-on coating, or other suitable methods. In some embodiments, the hard mask material may include, for example but not limited to, silicon oxide, silicon nitride, silicon oxynitride (SiON), silicon carbide (SiC), silicon oxycarbide (SiOC), spin-on glass (SOG), a low-k film, tetraethyl orthosilicate (TEOS), plasma enhanced CVD oxide, high-aspect-ratio-process (HARP) formed oxide, amorphous carbon material, tetraethylortho silicate (TEOS), other suitable materials, or combinations thereof. The layer of the hard mask material is then patterned using photolithography and photoresist developing technology as known to those skilled in the art of semiconductor fabrication. The pattern formed in the layer of the hard mask material is then transferred to the layer of the polysilicon material and the layer of the gate dielectric material by an etching process (for example but not limited to, wet etching, dry etching, or a combination thereof) to form the poly gates 12a and the dummy poly gates 12b, 12c on the semiconductor substrate 11.

Referring to FIG. 1, the method 100 then proceeds to block 102, where a spacer layer is conformally deposited to cover the poly gates and the dummy poly gates. Referring to the example illustrated in FIG. 3, a spacer layer 14 is conformally deposited to cover the poly gates 12a, the dummy poly gates 12b, 12c, and the semiconductor substrate 11. The conformal deposition may be implemented by a suitable deposition process as known to those skilled in the art of semiconductor fabrication, for example but not limited to, CVD, PECVD, ALD, plasma-enhanced atomic layer deposition (PEALD), or other suitable methods. In some embodiments, the spacer layer 14 may include, for example but not limited to, silicon oxide, silicon nitride, silicon carbide, silicon oxycarbide, silicon oxynitride, silicon carbonitride, silicon oxycarbonitride, or combinations thereof.

Referring to FIG. 1, the method 100 then proceeds to block 103, where the spacer layer is formed into a plurality of spacers to laterally cover the poly gates and the dummy poly gates. Referring to the examples illustrated in FIGS. 3 and 4, the spacer layer 14 is anisotropically etched to etch away the horizontal portions of the spacer layer 14 to form a plurality of spacers 14a extending upwardly from the semiconductor substrate 11 and laterally covering the poly gates 12a and the dummy poly gates 12b, 12c.

Referring to FIG. 1, the method 100 then proceeds to block 104, where the semiconductor substrate is recessed to form a plurality of source/drain recesses. Referring to the examples illustrated in FIGS. 4 and 5, the semiconductor substrate 11 is recessed by an anisotropic etching process to form a plurality of source/drain recesses 15. Each of the poly gates 12a is disposed between corresponding two of the source/drain recesses 15. The anisotropic etching process may be a suitable anisotropic etching as known to those skilled in the art of semiconductor fabrication, for example but not limited to, anisotropic dry etching.

Referring to FIG. 1, the method 100 then proceeds to block 105, where a first patterned photoresist layer is formed. Referring to the example illustrated in FIG. 6, a first photoresist layer is applied and patterned on the semiconductor substrate 11 to form a first patterned photoresist layer 16, which is disposed on the first, second, and fifth OD regions 11a, 11b, 11e to cover the poly gates 12a, the dummy poly gate(s) 12c, and the source/drain recesses 15 in the first and second OD regions 11a, 11b and the poly gate(s) 12a, the dummy poly gate(s) 12b, and the source/drain recesses 15 in the fifth OD region 11e. In some embodiments, the patterning of the first photoresist layer may be performed using methods known in the art and may include processing steps such as photoresist coating, soft baking, mask aligning, pattern exposing, developing, and hard baking. In some embodiments, the first patterned photoresist layer 16 may be replaced by a patterned hard mask.

Referring to FIG. 1, the method 100 then proceeds to block 106, where a plurality of first source/drain regions are formed. Referring to the examples illustrated in FIGS. 6 and 7, a plurality of first source/drain regions 17a are formed in the third, fourth, and sixth OD regions 11c, 11d, 11f. In some embodiments, the first source/drain regions 17a may be formed by epitaxially growing a semiconductor material in the recesses 15 in the third, fourth, and sixth OD regions 11c, 11d, 11f through a selective epitaxial growth (SEG) process. The first source-drain regions 17a may be, for example, but not limited to, crystalline silicon (or other suitable semiconductor materials) in-situ doped with a P-type impurity during the SEG process, so as to form PMOS transistors in the third, fourth, and sixth OD regions 11c, 11d, 11f (i.e., P-type OD regions). The P-type impurity may be, for example but not limited to, boron, aluminum, gallium, indium, $BF_2$, other suitable materials, or combinations thereof. The first source-drain regions 17a may include one or multiple layers of the semiconductor material. In some embodiments, the first source/drain regions 17a may be fabricated by forming a SiGe alloy layer in the recesses 15 in the third, fourth, and sixth OD regions 11c, 11d, 11f through a SEG process and forming a Si cap layer on top of the SiGe alloy layer, followed by implanting a P-type light doping grain (for example but not limited to, boron, aluminum, gallium, indium, $BF_2$, other suitable materials, or combinations thereof).

Referring to FIG. 1, the method 100 then proceeds to block 107, where the first patterned photoresist layer is removed and a second patterned photoresist layer is formed. Referring to the examples illustrated in FIGS. 7 and 8, the first patterned photoresist layer 16 is removed and a second patterned photoresist layer 18 is formed. In some embodiments, the first patterned photoresist layer 16 may be removed by an etching process, for example but not limited, a wet etching process. The second patterned photoresist layer 18 may be formed by applying and patterning a second photoresist layer on the semiconductor substrate 11. The second patterned photoresist layer 18 thus formed is disposed on the third, fourth, and sixth OD regions 11c, 11d, 11f to cover the poly gates 12a, the dummy poly gate(s) 12c, and the first source/drain regions 17a in the third and fourth OD regions 11c, 11d and the poly gate(s) 12a, the dummy poly gate(s) 12b, and the first source/drain regions 17a in the sixth OD region 11f. In some embodiments, the patterning of the second photoresist layer may be performed using methods known in the art and may include processing steps such as photoresist coating, softbaking, mask aligning, pattern exposing, developing, and hard baking. In some embodiments, the second patterned photoresist layer 18 may be replaced by a patterned hard mask.

Referring to FIG. 1, the method 100 then proceeds to block 108, where a plurality of second source/drain regions are formed. Referring to the examples illustrated in FIGS. 8 and 9, a plurality of second source/drain regions 17b are formed in the first, second, and fifth OD regions 11a, 11b, 11e. In some embodiments, the second source/drain regions 17b may be formed by epitaxially growing a semiconductor material in the recesses 15 in the first, second, and fifth OD regions 11a, 11b, 11e through a selective epitaxial growth (SEG) process. The second source-drain regions 17b may be, for example but not limited to, crystalline silicon (or other suitable semiconductor materials) in-situ doped with an N-type impurity during the SEG process, so as to form NMOS transistors in the first, second, and fifth OD regions 11a, 11b, 11 e (i.e., N-type OD regions). The N-type impurity may be, for example but not limited to, phosphorous, nitrogen, arsenic, antimony, other suitable materials, or combinations thereof. The second source-drain regions 17b may include one or multiple layers of the semiconductor material. In some embodiments, the second source/drain regions 17b may be fabricated by forming a SiGe alloy layer in the recesses 15 in the first, second, and fifth OD regions 11a, 11b, 11 e through a SEG process and forming a Si cap layer on top of the SiGe alloy layer, followed by implanting an N-type light doping drain (for example but not limited to, phosphorous, nitrogen, arsenic, antimony, other suitable materials, or combinations thereof).

Referring to FIG. 1, the method 100 then proceeds to block 109, where the second patterned photoresist layer is removed. Referring to the examples illustrated in FIGS. 9 and 10, the second patterned photoresist layer 18 is removed by an etching process, for example but not limited, a wet etching process. As a result, at least one of the NMOS transistors is formed on each of the first, second, and fifth OD regions 11a, 11b, 11e (i.e., N-type OD regions), and at least one of the PMOS transistors is formed on each of the third, fourth, and sixth OD regions 11c, 11d, 11f (i.e., P-type OD regions). Each of the NMOS transistors includes one of the poly gates 12a and corresponding two of the second source/drain regions 17b. Each of the PMOS transistors includes one of the poly gates 12a and corresponding two of the first source/drain regions 17a.

Referring to FIG. 1, the method 100 then proceeds to block 110, where an interlayer dielectric (ILD) layer is formed. Referring to the example illustrated in FIG. 11, an ILD layer 19 is formed on the semiconductor substrate 11 to cover the first and second source/drain regions 17a, 17b and the STI 13, and to have a top surface which is coplanar with top surfaces of the poly gates 12a and the dummy poly gates 12b, 12c. The ILD layer 19 is made of a dielectric material. In some embodiments, examples of the dielectric material may include, for example but not limited to, silicon oxide, silicon nitride, silicon oxynitride (SiON), phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and combinations thereof. In some embodiments, the ILD layer 19 may be deposited on the semiconductor substrate 11 to have a suitable thickness by, for example but not limited to, CVD, HDPCVD, SACVD, spin-on, sputtering, or other suitable methods. In some embodiments, the ILD layer 19 may have a thickness in the range from about 3000 Å to about 4500 Å.

Referring to FIG. 1, the method 100 then proceeds to block 111, where a patterned mask layer is formed on the ILD layer. Referring to the example illustrated in FIG. 12, a patterned mask layer 20 is formed on the ILD layer 19 using photolithography and photoresist developing technology as known to those skilled in the art of semiconductor fabrication. The patterned mask layer 20 thus formed has a first opening 201 and a second opening 202 to respectively expose the dummy poly gate 12c (a CPODE dummy poly gate) on the common edge of the first and second OD regions 11a, 11b and the dummy poly gate 12c (a CPODE dummy poly gate) on the common edge of the third and fourth OD regions 11c, 11d. Materials suitable for forming the patterned mask layer 20 include, for example but not limited to, silicon oxide, silicon nitride, silicon carbide, silicon oxycarbide, silicon oxynitride, silicon carbonitride, silicon oxycarbonitride, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof.

Referring to FIG. 1, the method 100 then proceeds to block 112, where a first trench and a second trench are simultaneously formed. Referring to the example illustrated in FIGS. 12 and 13, the dummy poly gate 12c on the common edge of the first and second OD regions 11a, 11b and a portion of the semiconductor substrate 11 therebelow and the dummy poly gate 12c on the common edge of the third and fourth OD regions 11c, 11 d and a portion of the semiconductor substrate 11 therebelow are removed simultaneously by an etching process (for example but not limited to, wet etching, dry etching, or a combination thereof) through the first and second openings 201, 202 to form a first trench 21 and a second trench 22, which penetrate through the ILD layer 19 to to extend into the semiconductor substrate 11 at the common edge of the first and second OD regions 11a, 11b and the common edge of the third and fourth OD regions 11c, 11d, respectively. The first trench 21 separates two adjacent ones of the NMOS transistors from each other, and the second trench 22 separates two adjacent ones of the PMOS transistors from each other.

Referring to FIG. 1, the method 100 then proceeds to block 113, where the first trench and the second trench are filled simultaneously with a dielectric material. Referring to the examples illustrated in FIGS. 13 and 14, the first trench 21 and the second trench 22 are filled simultaneously with a dielectric material to form a first isolation structure 23 extending into the semiconductor substrate 11 at the common edge of the first and second OD regions 11a, 11b and a second isolation structure 24 extending into the semiconductor substrate 11 at the common edge of the third and fourth OD regions 11c, 11d, so that strained NMOS transistors and strained PMOS transistors are formed simultaneously. Two adjacent ones of the strained NMOS transistors are separated by the first isolation structure 23, and two adjacent ones of the strained PMOS transistors are separated from each other by the second isolation structure 24. In some embodiments, the dielectric material includes, for example but not limited to, silicon oxide, silicon nitride, silicon carbide, silicon oxycarbide, silicon oxynitride, silicon carbonitride, silicon oxycarbonitride, a high-k dielectric material, or combinations thereof. Each of the first and second isolation structures 23, 24 may include one or multiple layers of the exemplified dielectric material. The first isolation structure 23 includes the dielectric material(s) which is (are) the same as that (those) of the second isolation structure 24.

Electrical performance effect of an isolation structure on strained NMOS and PMOS transistors may be different depending on a composition of a dielectric material for forming the isolation structure. For example, as shown in Table 1 below, when an isolation structure is made of dielectric material A, compared to a PODE PMOS transistor without the isolation structure, a strained CPODE PMOS transistor has a 5% improvement in terms of electrical performance as attributed to the isolation structure, but compared to a PODE NMOS transistor without the isolation structure, electrical performance of a strained CPODE NMOS transistor is degraded by 7% resulting from the isolation structure. When an isolation structure is made of dielectric material B, compared to a PODE PMOS transistor without the isolation structure, a strained CPODE PMOS transistor has a 2% improvement in terms of electrical performance as attributed to the isolation structure, but as compared to a PODE NMOS transistor without the isolation structure, electrical performance of a strained CPODE NMOS transistor is degraded by 2% resulting from the isolation structure.

TABLE 1

| Electrical performance | Dielectric material A | Dielectric material B |
| --- | --- | --- |
| PODE | Reference | Reference |
| CPODE NMOS | −7% | −2% |
| CPODE PMOS | +5% | +2% |

Figure 15:
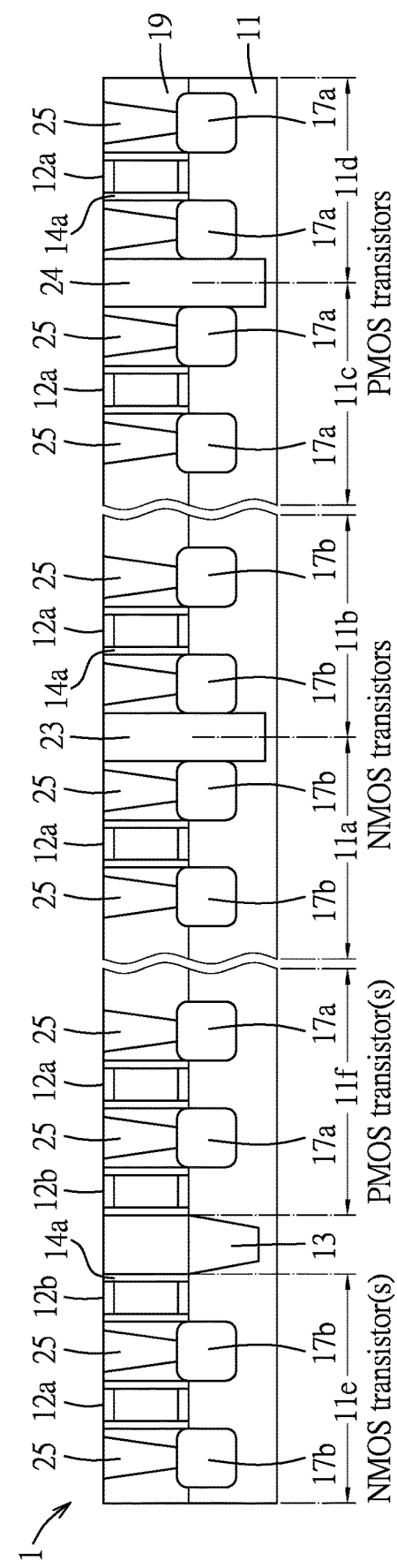
FIG. 15 illustrates a schematic view showing an additional stage for further processing the semiconductor device manufactured in accordance with some embodiments

Referring to the example illustrated in FIG. 15, source/drain via contacts 25 are formed in the ILD layer 19 by a single damascene process. The source/drain via contacts 25 are formed in the ILD layer 19 to be in direct contact with the first and second source/drain regions 17a, 17b, respectively. In some embodiments, the source/drain via contacts 25 are formed by the following steps. First, source/drain via openings are formed through the ILD layer 19 to expose the first and second source/drain regions 17a, 17b from the source/drain via openings, respectively. That is, the source/drain via openings extend from a top surface of the ILD layer 19 to top surfaces of the first and second source/drain regions 17a, 17b. After the source/drain via openings are formed, the source/drain via contacts 25 are formed in the ILD layer 19 by depositing a metallic material to fill the source/drain via openings and removing excess of the metallic material by a planarization technique, such as chemical mechanical planarization (CMP). In some embodiments, the metallic material may include, for example but not limited to, cobalt, tungsten, copper, titanium, tantalum, aluminum, zirconium, hafnium, or combinations thereof. In some embodiments, deposition of the metallic material may be performed by a suitable technique, such as CVD, ALD, plating, or other suitable deposition techniques.

Figure 16A:
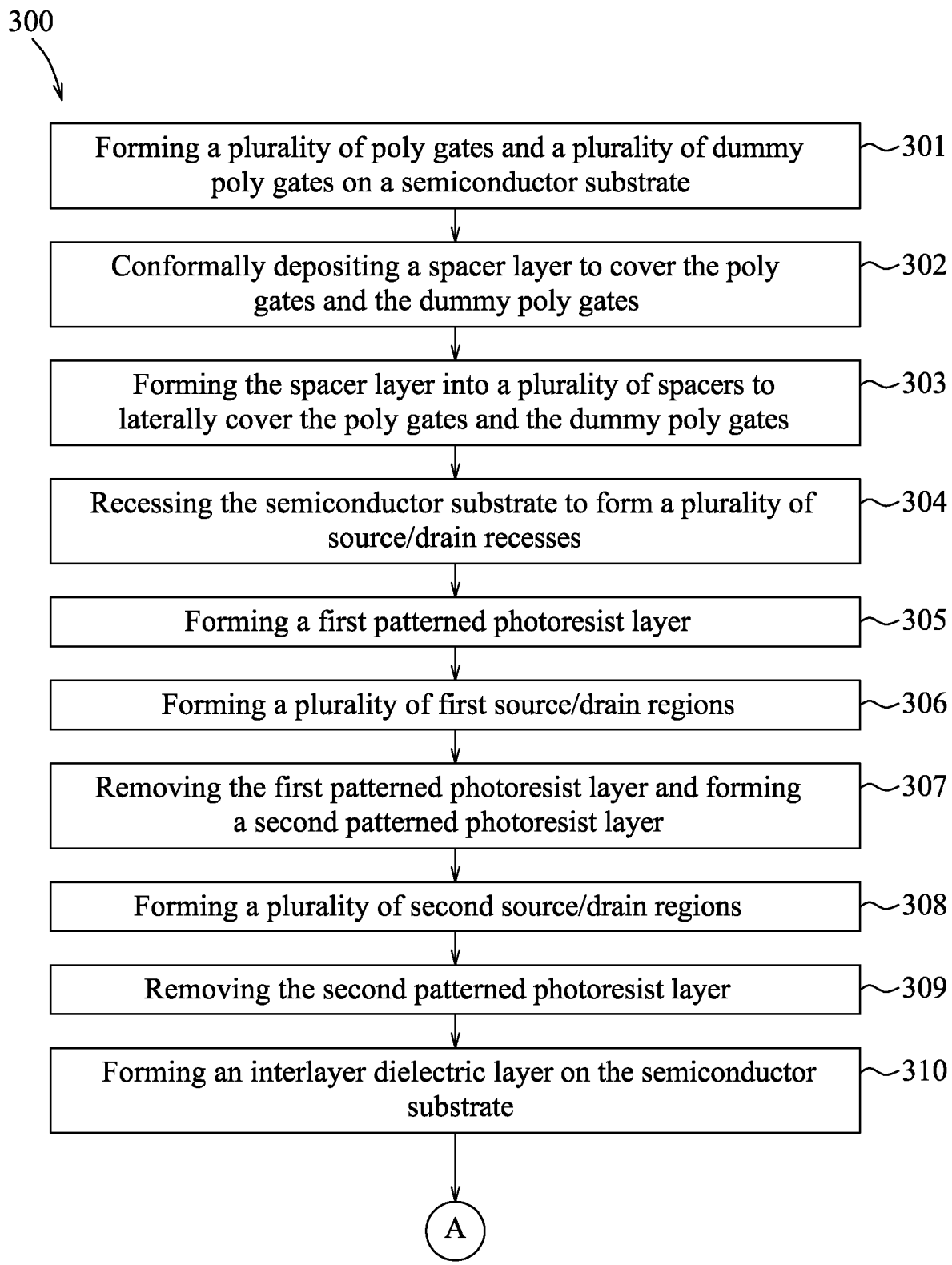
FIGS. 16A and 16B are flow diagrams illustrating a method for manufacturing a semiconductor device including strained transistors in accordance with some embodiments.
Figure 16B:
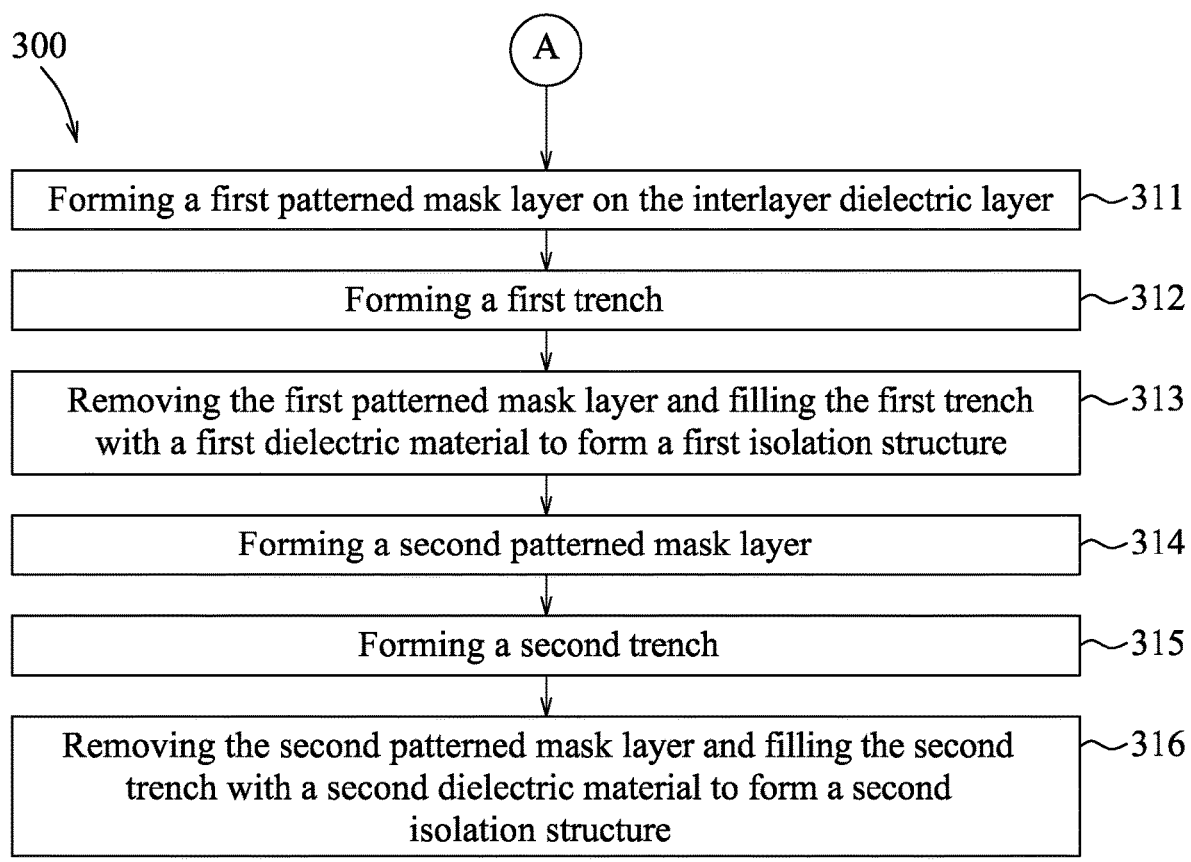
Figure 17:
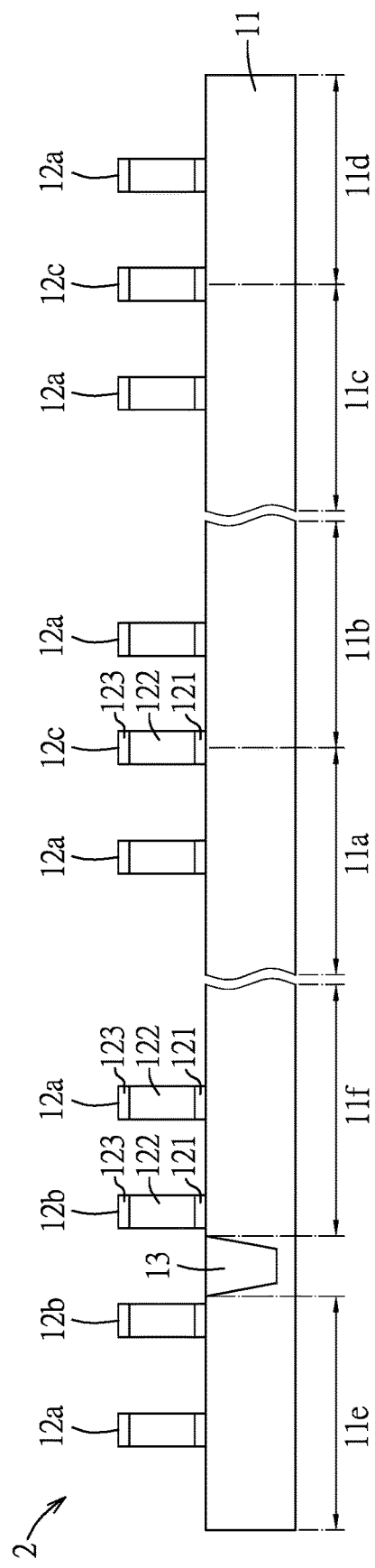
Figure 18:
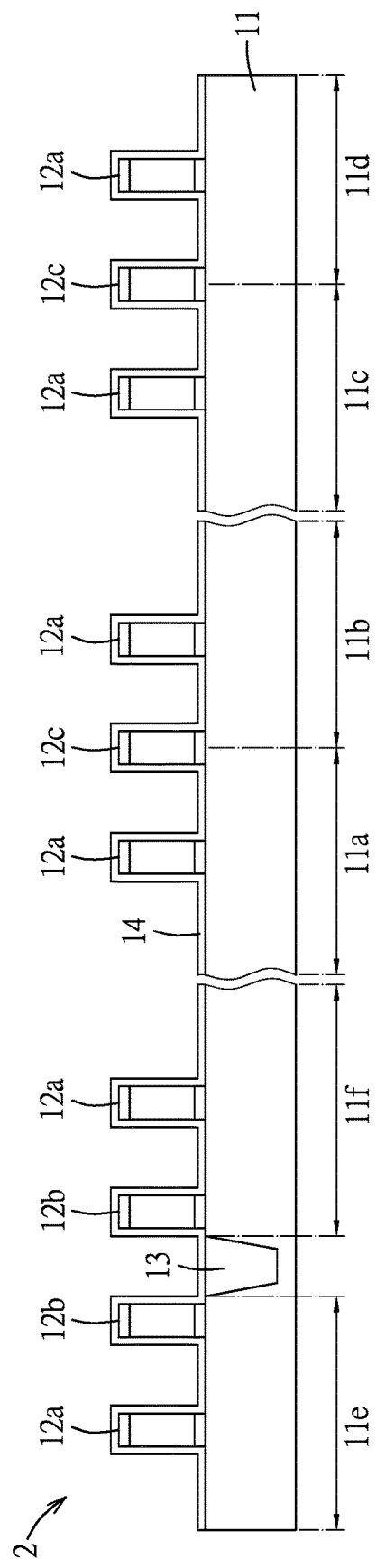
Figure 19:
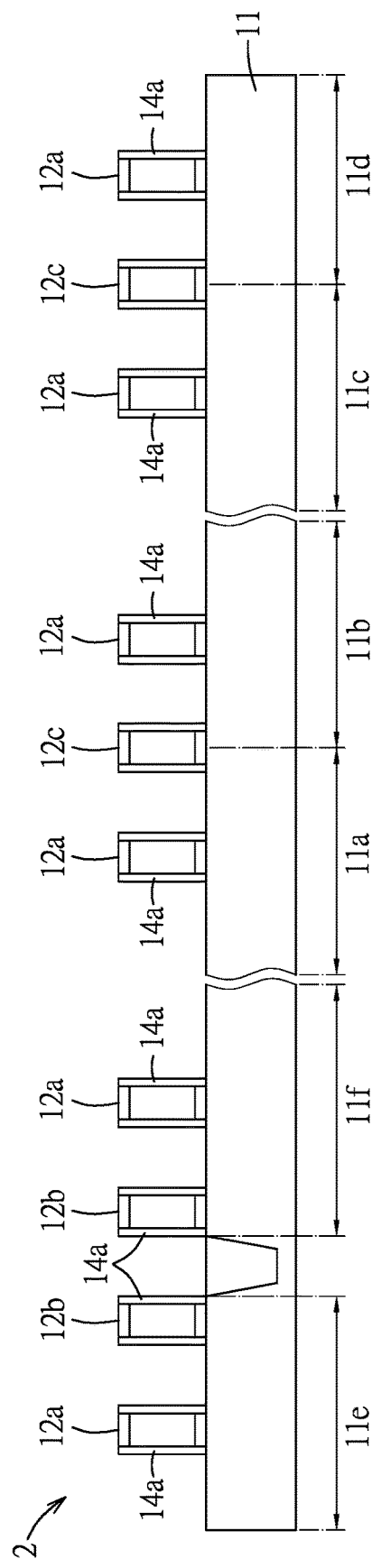
Figure 20:
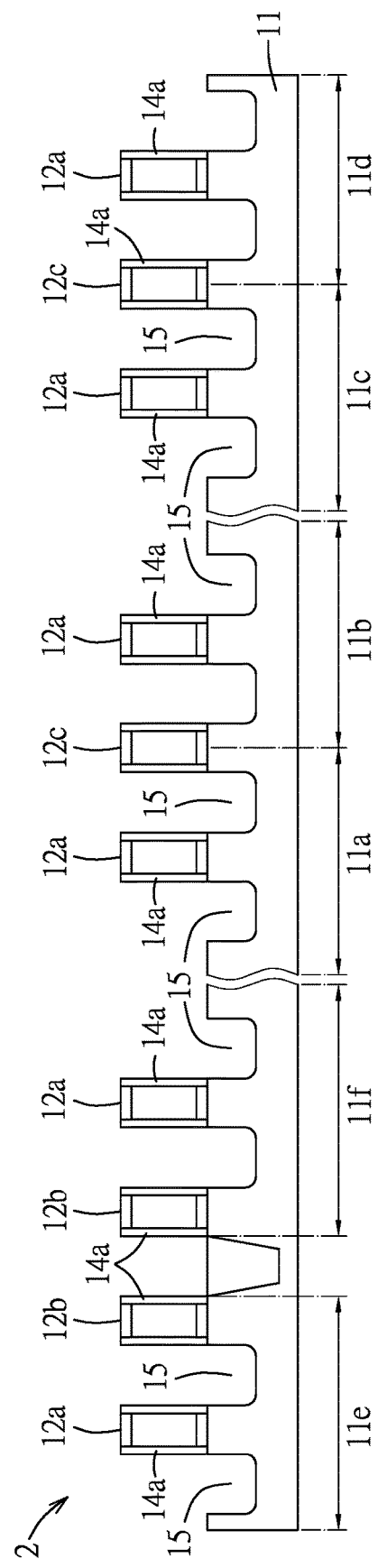
Figure 21:
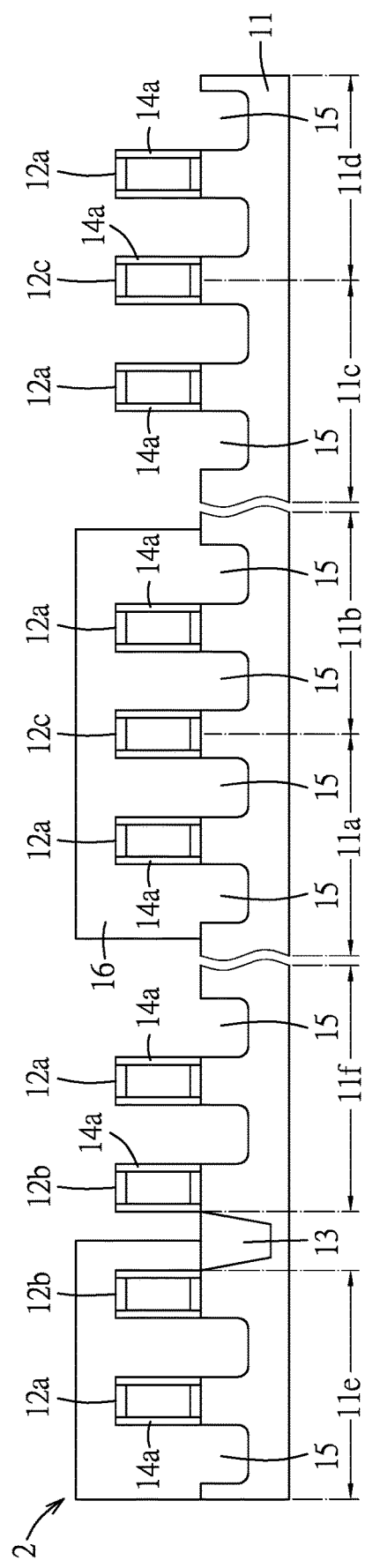
Figure 22:
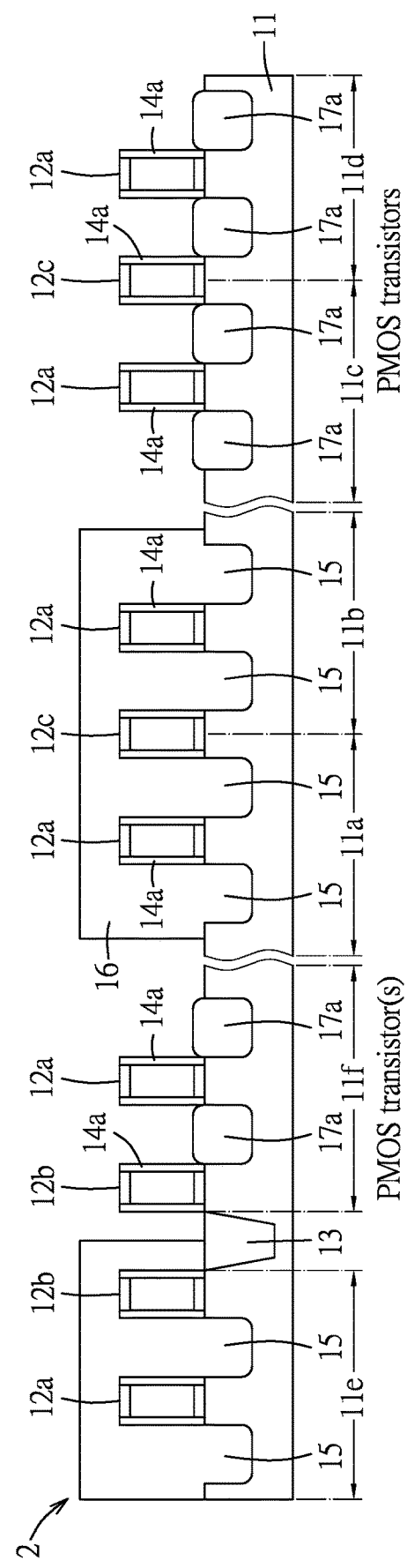
Figure 23:
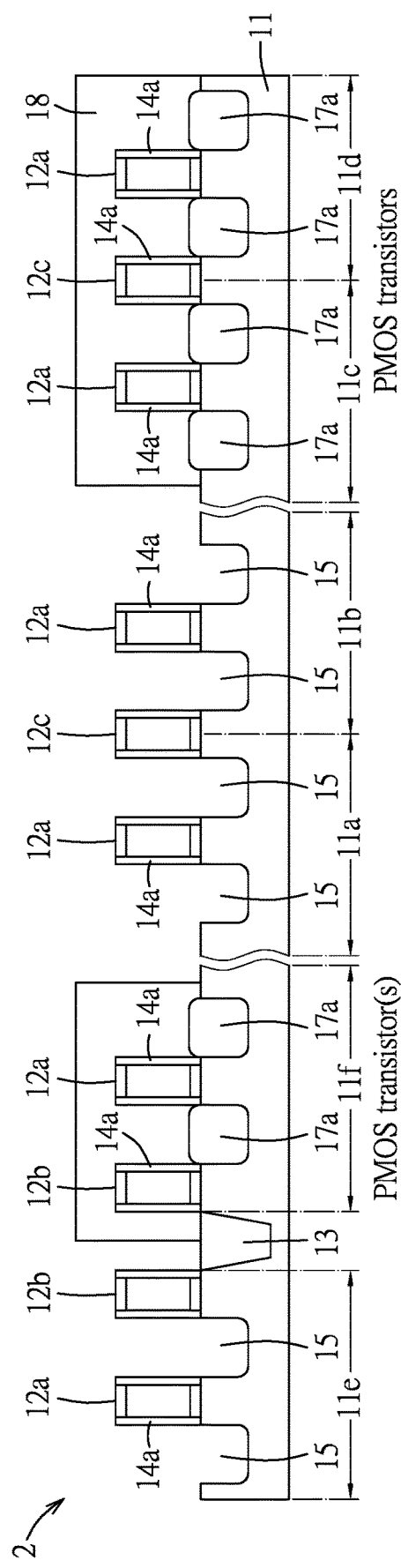
Figure 24:
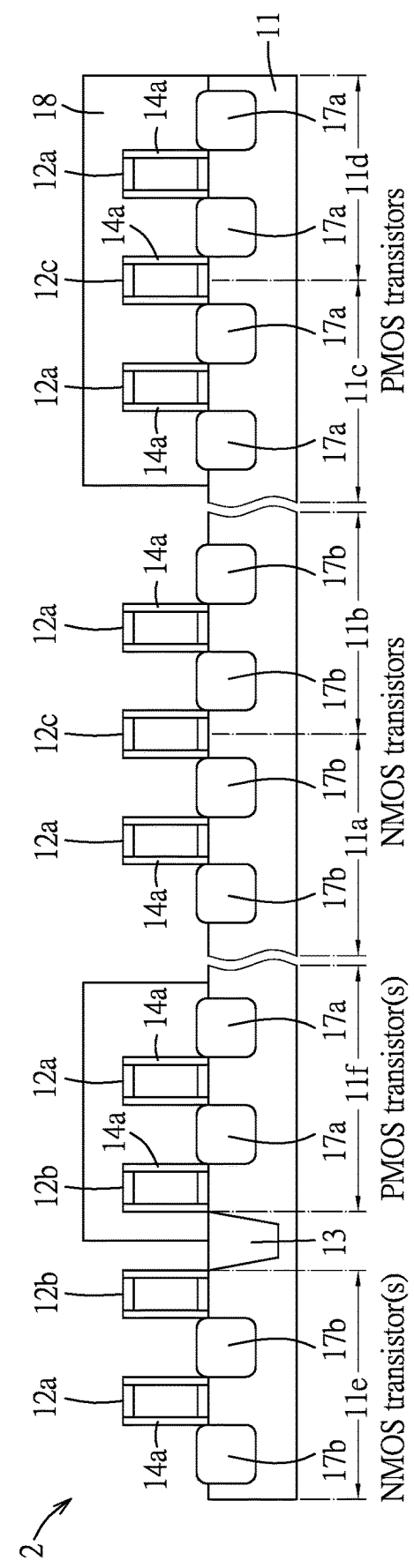
Figure 25:
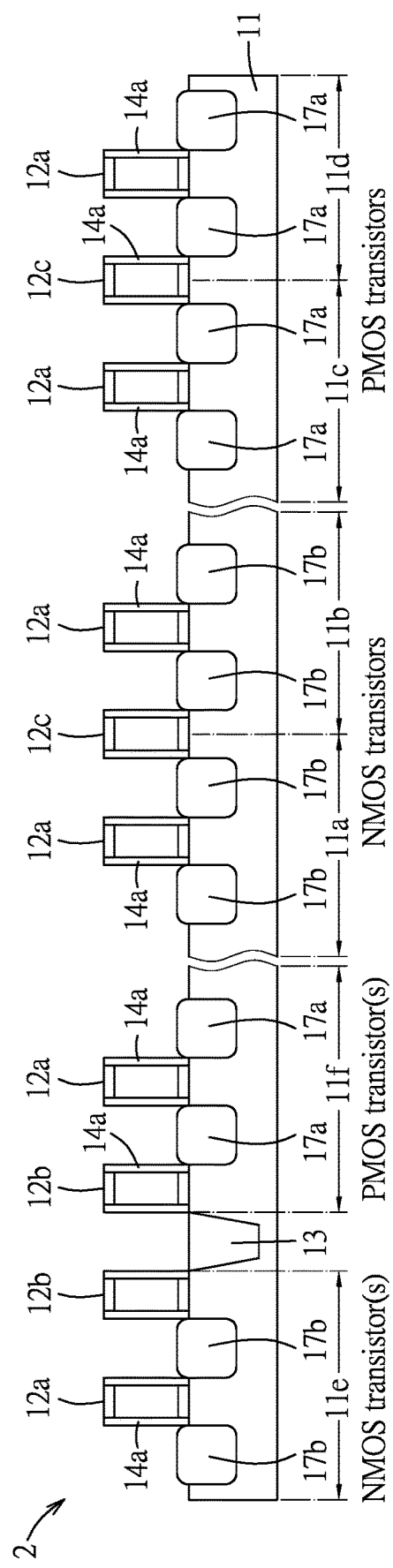
Figure 26:
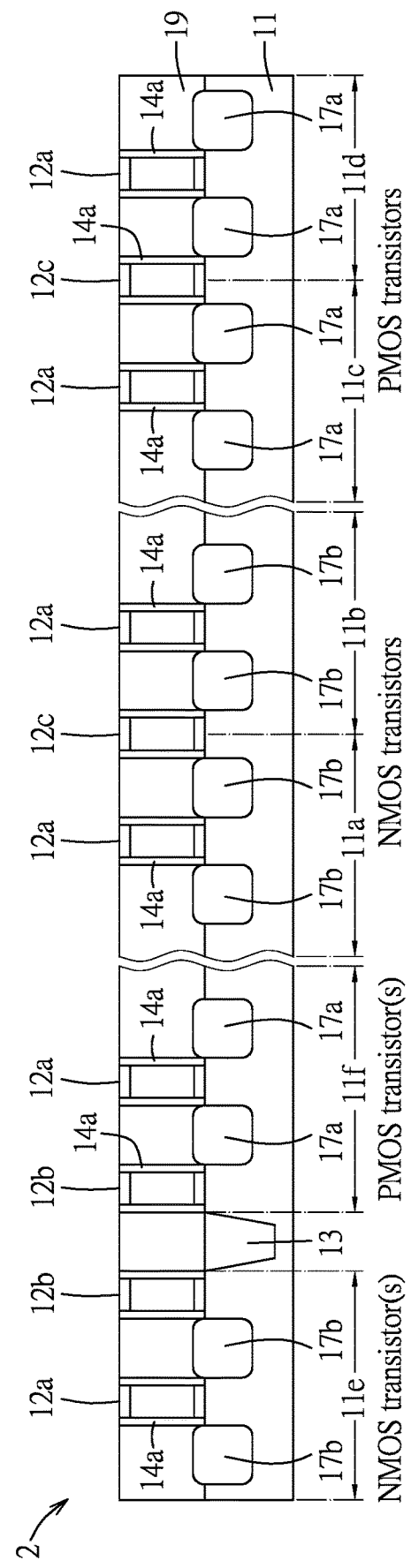
Figure 27:
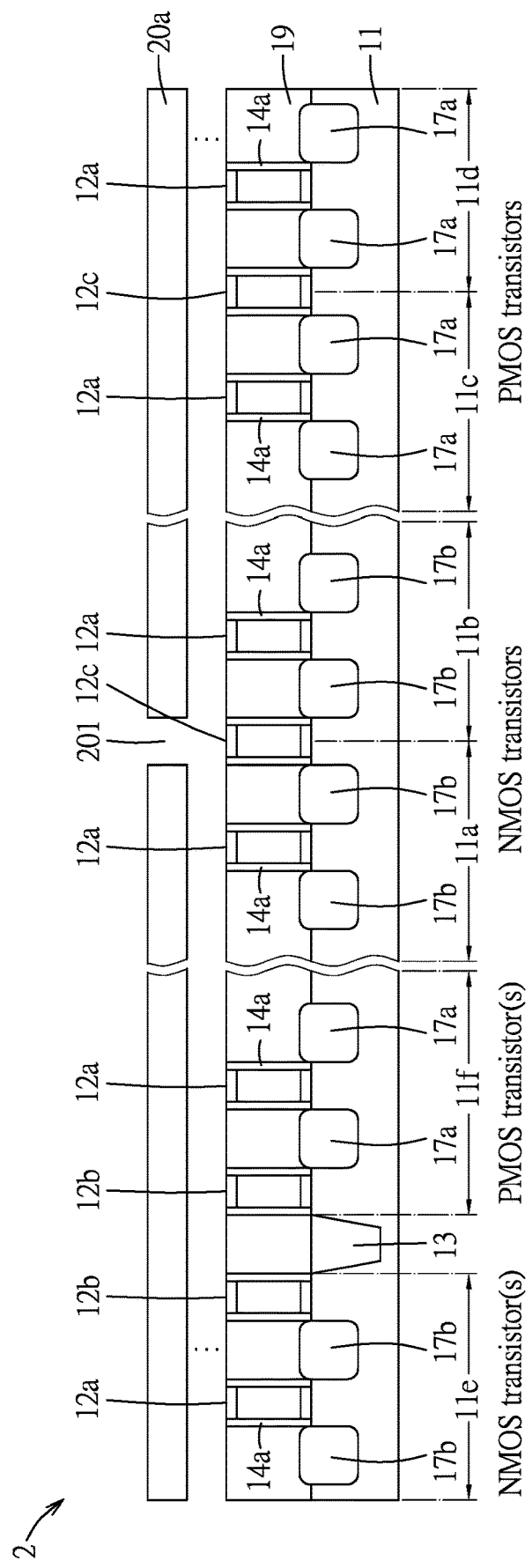
Figure 28:
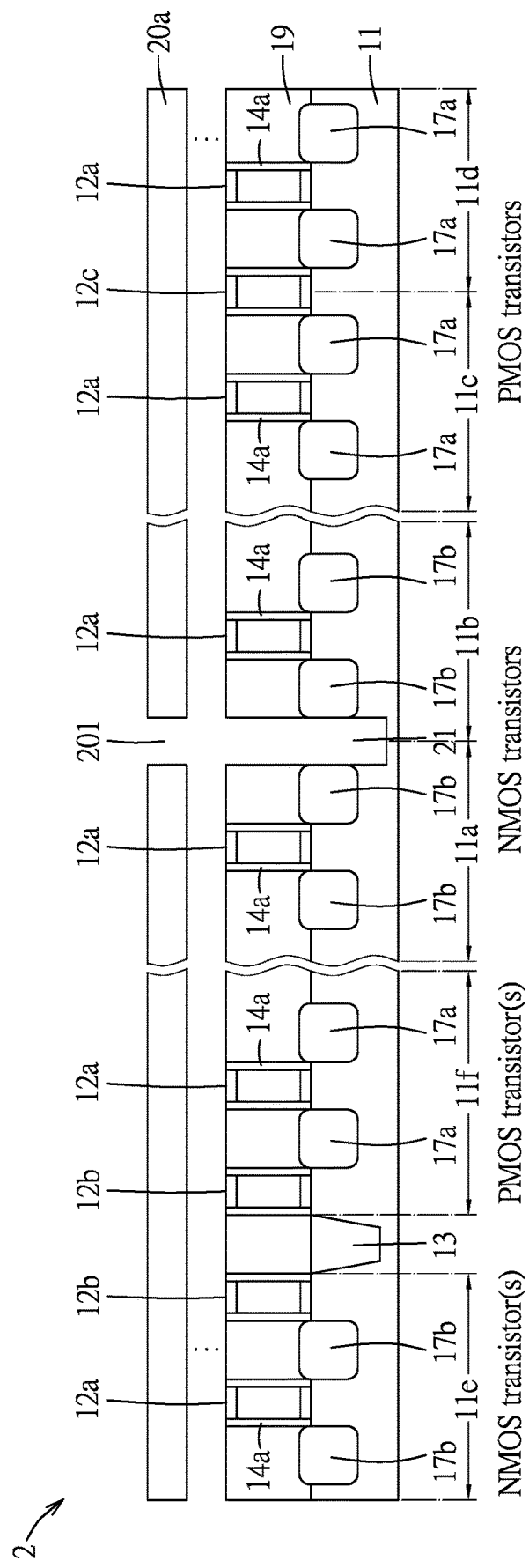
Figure 29:
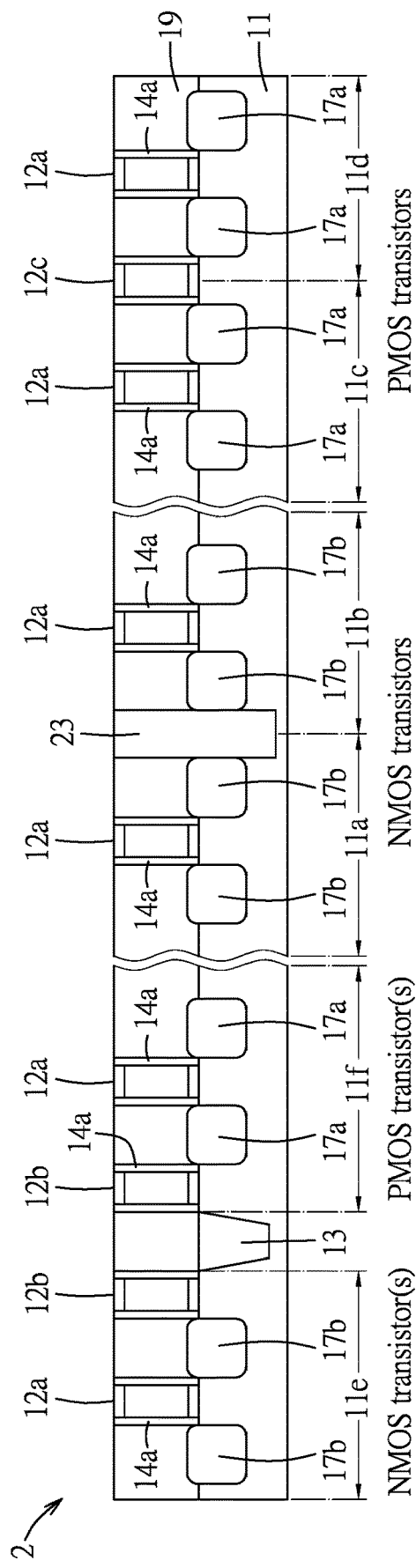
Figure 30:
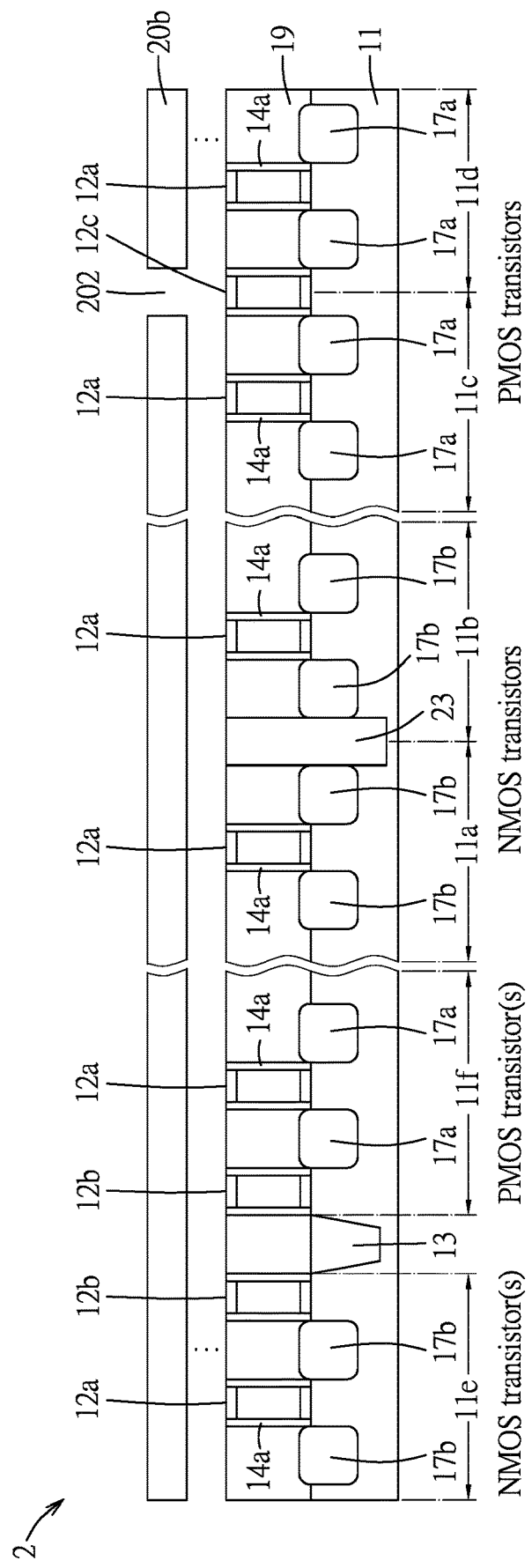
Figure 31:
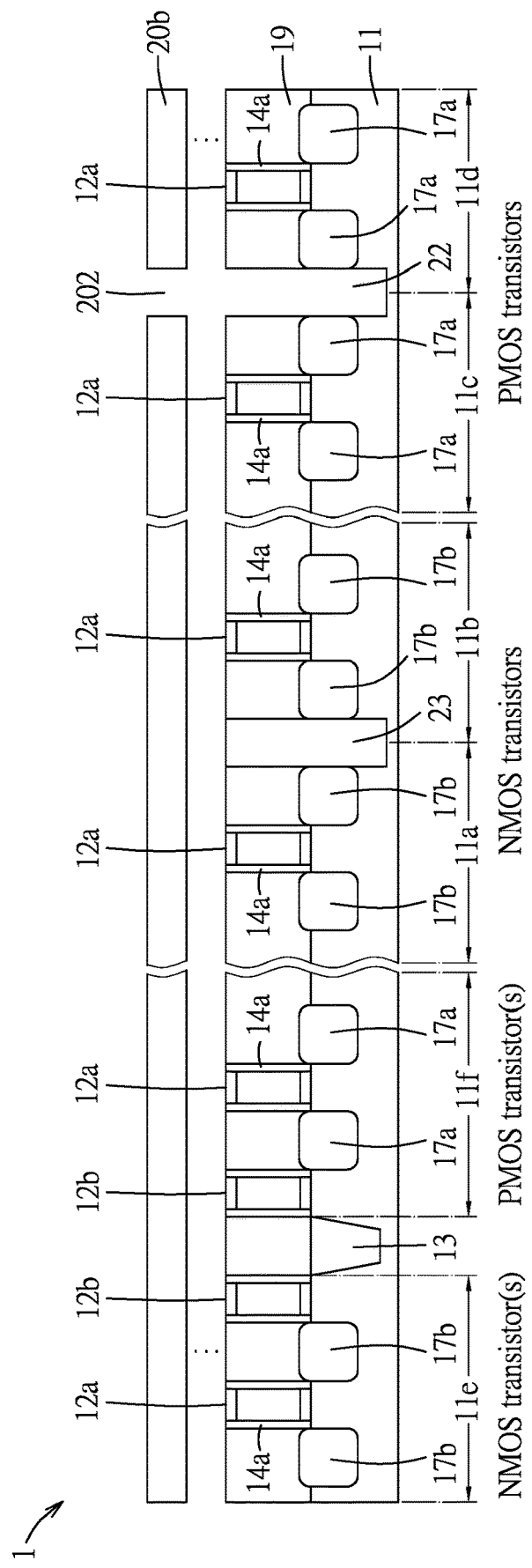

FIGS. 16A and 16B illustrate a method 300 for manufacturing a semiconductor device including strained transistors in accordance with some embodiments. FIGS. 17 to 32 illustrate schematic views showing of a semiconductor device 2 during various stages of the method 300 of FIGS. 16A and 16B. The method 300 and the semiconductor device 2 are collectively described below. However, additional steps can be provided before, after or during the method 300, and some of the steps described herein may be replaced by other steps or be eliminated. Similarly, further additional features may be present in the semiconductor device 2, and/or features present may be replaced or eliminated in additional embodiments.

Referring to FIG. 16A, the method 300 begins at block 301, where a plurality of poly gates and a plurality of dummy poly gates are formed on a semiconductor substrate. Referring to the example illustrated in FIG. 17, a plurality of poly gates 12a and a plurality of dummy poly gates 12b, 12c are formed on a semiconductor substrate 11. The semiconductor substrate 11 includes a first oxide definition (OD) region 11a, a second OD region 11b, a third OD region 11c, a fourth OD region 11d, a fifth OD region 11e, and 1 sixth OD region 11f. One of the dummy poly gates 12c is on a common edge of the first and second OD regions 11a, 11b, and is referred to herein as a CPODE dummy poly gate. Another of the dummy poly gates 12c is on a common edge of the third and fourth OD regions 11c, 11d, and is referred to herein as a CPODE dummy poly gate. Two of the dummy poly gates 12b are respectively on two adjacent edges of the fifth OD region 11e and the sixth OD region 11f, and are referred to herein as PODE dummy poly gates. A shallow trench isolation (STI) 13 is formed in the semiconductor substrate 11 and between the two of the dummy poly gates 12b. Details regarding the material of the semiconductor substrate 11 and the material and the formation of the STI 13, the poly gates 12a, and the dummy poly gates 12b, 12c are the same as or similar to those described above with respect to the semiconductor device 1 referring to FIG. 2.

Referring to FIG. 16A, the method 300 then proceeds to block 302, where a spacer layer is conformally deposited to cover the poly gates and the dummy poly gates. Referring to the example illustrated in FIG. 18, a spacer layer 14 is conformally deposited to cover the poly gates 12a, the dummy poly gates 12b, 12c, and the semiconductor substrate 11. Details regarding the material and the formation of the spacer layer 14 are the same as or similar to those described above with respect to the semiconductor device 1 referring to FIG. 3.

Referring to FIG. 16A, the method 300 then proceeds to block 303, where the spacer layer is formed into a plurality of spacers to laterally cover the poly gates and the dummy poly gates. Referring to the examples illustrated in FIGS. 18 and 19, the spacer layer 14 is anisotropically etched to etch away the horizontal portions of the spacer layer 14 to form a plurality of spacers 14a extending upwardly from the semiconductor substrate 11 and laterally covering the poly gates 12a and the dummy poly gates 12b, 12c.

Referring to FIG. 16A, the method 300 then proceeds to block 304, where the semiconductor substrate is recessed to form a plurality of source/drain recesses. Referring to the examples illustrated in FIGS. 19 and 20, the semiconductor substrate 11 is recessed by an anisotropic etching process to form a plurality of source/drain recesses 15. Each of the poly gates 12a is disposed between corresponding two of the source/drain recesses 15. The anisotropic etching process may be a suitable anisotropic etching process as known to those skilled in the art of semiconductor fabrication, for example but not limited to, anisotropic dry etching.

Referring to FIG. 16A, the method 300 then proceeds to block 305, where a first patterned photoresist layer is formed. Referring to the example illustrated in FIG. 21, a first patterned photoresist layer 16 is formed on the first, second, and fifth OD regions 11a, 11b, 11e to cover the poly gates 12a, the dummy poly gate(s) 12c, and the source/drain recesses 15 in the first and second OD regions 11a, 11b and the poly gate(s) 12a, the dummy poly gate(s) 12b, and the source/drain recesses 15 in the fifth OD region 11e. Details regarding the formation of the first patterned photoresist layer 16 are the same as or similar to those described above with respect to the semiconductor device 1 referring to FIG. 6. In some embodiments, the first patterned photoresist layer 16 may be replaced by a patterned hard mask.

Referring to FIG. 16A, the method 300 then proceeds to block 306, where a plurality of first source/drain regions are formed. Referring to the examples illustrated in FIGS. 21 and 22, a plurality of first source/drain regions 17a are formed in the third, fourth, and sixth OD regions 11c, 11d, 11f. Details regarding the material and the formation of the first source/drain regions 17a are the same as or similar to those described above with respect to the semiconductor device 1 referring to FIGS. 6 and 7.

Referring to FIG. 16A, the method 300 then proceeds to block 307, where the first patterned photoresist layer is removed and a second patterned photoresist layer is formed. Referring to the examples illustrated in FIGS. 22 and 23, the first patterned photoresist layer 16 is removed and a second patterned photoresist layer 18 is formed. Details regarding the removal of the first patterned photoresist layer 16 and the formation of the second patterned photoresist layer 18 are the same as or similar to those described above with respect to the semiconductor device 1 referring to FIGS. 7 and 8. The second patterned photoresist layer 18 thus formed is disposed on the third, fourth, and sixth OD regions 11c, 11d, 11f to cover the poly gates 12a, the dummy poly gate(s) 12c, and the first source/drain regions 17a in the third and fourth OD regions 11c, 11d and the poly gate(s) 12a, the dummy poly gate(s) 12b, and the first source/drain regions 17a in the sixth OD region 11f. In some embodiments, the second patterned photoresist layer 18 may be replaced by a patterned hard mask.

Referring to FIG. 16A, the method 300 then proceeds to block 308, where a plurality of second source/drain regions are formed. Referring to the examples illustrated in FIGS. 23 and 24, a plurality of second source/drain regions 17b are formed in the first, second, and fifth OD regions 11a, 11b, 11e. Details regarding the material and the formation of the second source/drain regions 17b are the same as or similar to those described above with respect to the semiconductor device 1 referring to FIGS. 8 and 9.

Referring to FIG. 16A, the method 300 then proceeds to block 309, where the second patterned photoresist layer is removed. Referring to the examples illustrated in FIGS. 24 and 25, the second patterned photoresist layer 18 is removed by an etching process, for example but not limited, a wet etching process. As a result, at least one of the NMOS transistors is formed on each of the first, second, and fifth OD regions 11a, 11b, 11e (i.e., N-type OD regions), and at least one of the PMOS transistors is formed on each of the third, fourth, and sixth OD regions 11c, 11d, 11f (i.e., P-type OD regions). Each of the NMOS transistors includes one of the poly gates 12a and corresponding two of the second source/drain regions 17b. Each of the PMOS transistors includes one of the poly gates 12a and corresponding two of the first source/drain regions 17a.

Referring to FIG. 16A, the method 300 then proceeds to block 310, where an interlayer dielectric (ILD) layer is formed. Referring to the example illustrated in FIG. 26, an ILD layer 19 is formed on the semiconductor substrate 11 to cover the first and second source/drain regions 17a, 17b and the STI 13, and to have a top surface which is coplanar with top surfaces of the poly gates 12a and the dummy poly gates 12b, 12c. Details regarding the material and the formation of the ILD layer 19 are the same as or similar to those described above with respect to the semiconductor device 1 referring to FIG. 11.

Referring to FIG. 16B, the method 300 then proceeds to block 311, where a first patterned mask layer is formed on the ILD layer. Referring to the example illustrated in FIG. 27, a first patterned mask layer 20a is formed on the ILD layer 19 using photolithography and photoresist developing technology as known to those skilled in the art of semiconductor fabrication. The first patterned mask layer 20a thus formed has a first opening 201 to expose the dummy poly gate 12c (a CPODE dummy poly gate) on the common edge of the first and second OD regions 11a, 11b. Details regarding the material of the first patterned mask layer 20a are the same as or similar to those described above with respect to the semiconductor device 1 referring to FIG. 12.

Referring to FIG. 16B, the method 300 then proceeds to block 312, where a first trench is formed. Referring to the examples illustrated in FIGS. 27 and 28, the dummy poly gate 12c on the common edge of the first and second OD regions 11a, 11 b and a portion of the semiconductor substrate 11 therebelow are removed by an etching process (for example but not limited to, wet etching, dry etching, or a combination thereof) through the first opening 201 to form a first trench 21 penetrating the ILD layer 19 to extend into the semiconductor substrate 11 at the common edge of the first and second OD regions 11a, 11b. The first trench 21 separates two adjacent ones of the NMOS transistors from each other.

Referring to FIG. 16B, the method 300 then proceeds to block 313, where the first patterned mask layer is removed and the first trench is filled with a first dielectric material. Referring to the examples illustrated in FIGS. 28 and 29, the first patterned mask layer 20a is removed and the first trench 21 is filled with a first dielectric material to form a first isolation structure 23 extending into the semiconductor substrate 11 at the common edge of the first and second OD regions 11a, 11b, so that strained NMOS transistors are formed. Two adjacent ones of the strained NMOS transistors are separated by the first isolation structure 23. In some embodiments, the first dielectric material includes, for example but not limited to, silicon oxide, silicon nitride, silicon carbide, silicon oxycarbide, silicon oxynitride, silicon carbonitride, silicon oxycarbonitride, a high-k dielectric material, or combinations thereof. The first isolation structure 23 may include one or multiple layers of the exemplified dielectric material.

Referring to FIG. 16B, the method 300 then proceeds to block 314, where a second patterned mask layer is formed on the ILD layer. Referring to the example illustrated in FIG. 30, a second patterned mask layer 20b is formed on the ILD layer 19 using photolithography and photoresist developing technology as known to those skilled in the art of semiconductor fabrication. The second patterned mask layer 20b thus formed has a second opening 202 to expose the dummy poly gate 12c (a CPODE dummy poly gate) on the common edge of the third and fourth OD regions 11c, 11d. Details regarding the material of the second patterned mask layer 20b are the same as or similar to those described above with respect to the semiconductor device 1 referring to FIG. 12.

Referring to FIG. 16B, the method 300 then proceeds to block 315, where a second trench is formed. Referring to the examples illustrated in FIGS. 30 and 31, the dummy poly gate 12c on the common edge of the third and fourth OD regions 11c, 11d and a portion of the semiconductor substrate 11 therebelow are removed by an etching process (for example but not limited to, wet etching, dry etching, or a combination thereof) through the second opening 202 to form a second trench 22 penetrating through the ILD layer 19 to extend into the semiconductor substrate 11 at the common edge of the third and fourth OD regions 11c, 11d. The second trench 22 separates two adjacent ones of the PMOS transistors from each other.

Referring to FIG. 16B, the method 300 then proceeds to block 316, where the second patterned mask layer is removed and the second trench is filled with a second dielectric material. Referring to the examples illustrated in FIGS. 31 and 32, the second trench 22 is filled with a second dielectric material which has a dielectric composition different from that of the first dielectric material for forming the first isolation structure 23, to form a second isolation structure 24 extending into the semiconductor substrate 11 at the common edge of the third and fourth OD regions 11c, 11d, so that strained PMOS transistors are formed. Two adjacent ones of the strained PMOS transistors are separated by the second isolation structure 24. In some embodiments, the second dielectric material includes, for example but not limited to, silicon oxide, silicon nitride, silicon carbide, silicon oxycarbide, silicon oxynitride, silicon carbonitride, silicon oxycarbonitride, a high-k dielectric material, or combinations thereof. The second isolation structure 24 may include one or multiple layers of the exemplified dielectric material.

As described above, the electrical performance effect of an isolation structure on strained NMOS and/or PMOS transistors may be different depending on a dielectric material for forming the isolation structure. As shown in Table 1 above, since the electrical performance of the strained CPODE PMOS transistor can be improved by a relatively greater percentage (5%) when the material A is used to form the isolation structure as compared to that (2%) of the strained CPODE PMOS transistor when the material B is used to form the isolation structure, the material A can be used to form the second isolation structure 24 to separate two adjacent ones of the strained CPODE PMOS transistors in the semiconductor device 2. In addition, since the electrical performance of the strained CPODE NMOS transistor is degraded by a relatively less percentage (2%) when the material B is used to form the isolation structure as compared to that (7%) of the strained CPODE NMOS transistor when the material A is used to form the isolation structure, the material B can be used to form the first isolation structure 23 to separate two adjacent ones of the strained CPODE NMOS transistors in the semiconductor device 2. Therefore, the electrical performance of the semiconductor device 2, in which the isolation structures 23, 24 are formed from different isolation materials, can be further boosted compared to that of the semiconductor device 1, in which the isolation structures 23, 24 are formed from the same dielectric material.

Referring to the example illustrated in FIG. 33, source/drain via contacts 25 are formed in the ILD layer 19 by a single damascene process. The source/drain via contacts 25 are formed in the ILD layer 19 to be in direct contact with the first and second source/drain regions 17a, 17b, respectively. Details regarding the material and the formation of the source/drain via contacts 25 are the same as or similar to those described above with respect to the semiconductor device 1 referring to FIG. 15.

In accordance with some embodiments of the present disclosure, a method for manufacturing a semiconductor device includes forming a first CPODE dummy poly gate and a second CPODE dummy poly gate respectively on a common edge of a first OD region and a second OD region and a common edge of a third OD region and a fourth OD region of a semiconductor substrate; removing the first CPODE dummy poly gate and a portion of the semiconductor substrate below the first CPODE dummy poly gate to form a first trench extending into the semiconductor substrate to separate a first transistor and a second transistor which are adjacent to each other and which are disposed respectively in the first and second OD regions; filling the first trench with a first dielectric material to form a first isolation structure to isolate the first and second transistors from each other; removing the second CPODE dummy poly gate and a portion of the semiconductor substrate below the second CPODE dummy poly gate to form a second trench extending into the semiconductor substrate to separate a third transistor and a fourth transistor which are adjacent to each other and which are disposed respectively in the third and fourth OD regions; and filling the second trench with a second dielectric material having a dielectric composition different from that of the first dielectric material to form a second isolation structure to isolated the third and fourth transistors from each other.

In accordance with some embodiments of the present disclosure, the first and second dielectric materials are independently selected from silicon oxide, silicon nitride, silicon carbide, silicon oxycarbide, silicon oxynitride, silicon carbonitride, silicon oxycarbonitride, a high-k dielectric material, or combinations thereof.

In accordance with some embodiments of the present disclosure, the first isolation structure includes one or multiple layers of the first dielectric material.

In accordance with some embodiments of the present disclosure, the second isolation structure includes one or multiple layers of the second dielectric material.

In accordance with some embodiments of the present disclosure, forming the first trench and filling the first trench with the first dielectric material are performed prior to forming the second trench and filling the second trench with the second dielectric material.

In accordance with some embodiments of the present disclosure, forming the first trench is performed by a first etching process using a first patterned mask layer which has a first opening to expose the first CPODE dummy poly gate.

In accordance with some embodiments of the present disclosure, forming the second trench is performed by a second etching process using a second patterned mask layer which is different from the first patterned mask layer and which has a second opening to expose the second CPODE dummy poly gate.

In accordance with some embodiments of the present disclosure, The method for manufacturing a semiconductor device further includes forming an interlayer dielectric layer on the semiconductor layer prior to removing the first CPODE dummy poly gate and the portion of the semiconductor substrate below the first CPODE dummy poly gate and prior to removing the second CPODE dummy poly gate and the portion of the semiconductor substrate below the second CPODE dummy poly gate, so that the first and second trenches thus formed penetrate through the interlayer dielectric layer to extend into the semiconductor substrate.

In accordance with some embodiments of the present disclosure, a semiconductor device includes a semiconductor substrate which includes a first OD, a second OD region, a third OD region, and a fourth OD region; a first transistor in the first OD region; a second transistor in the second OD region; a third transistor in the third OD region; a fourth transistor in the fourth OD region; a first isolation structure which includes a first dielectric material and which extends into the semiconductor substrate at a common edge of the first and second OD regions to separate the first and second transistors from each other; and a second isolation structure which includes a second dielectric material having a dielectric composition different from that of the first dielectric material and which extends into the semiconductor substrate at a common edge of the third and fourth OD regions to separate the third and fourth transistors from each other.

In accordance with some embodiments of the present disclosure, the first and second dielectric materials are independently selected from silicon oxide, silicon nitride, silicon carbide, silicon oxycarbide, silicon oxynitride, silicon carbonitride, silicon oxycarbonitride, a high-k dielectric material, or combinations thereof.

In accordance with some embodiments of the present disclosure, the first isolation structure includes one or multiple layers of the first dielectric material.

In accordance with some embodiments of the present disclosure, the second isolation structure includes one or multiple layers of the second dielectric material.

In accordance with some embodiments of the present disclosure, the first and second transistors are NMOS transistors.

In accordance with some embodiments of the present disclosure, the third and fourth transistors are PMOS transistors.

In accordance with some embodiments of the present disclosure, the semiconductor device further includes an interlayer dielectric layer disposed on the semiconductor substrate, the first and second isolation structures penetrating through the interlayer dielectric layer to extend into the semiconductor substrate.

In accordance with some embodiments of the present disclosure, a semiconductor device includes a semiconductor substrate including a first N-type OD region and a second N-type OD region connected to each other by a common edge thereof, and a first P-type OD region and a second P-type OD region connected to each other by a common edge thereof; a first NMOS transistor and a second NMOS transistor disposed respectively in the first and second N-type OD regions; a first PMOS transistor and a second PMOS transistor disposed respectively in the first and second P-type OD regions; a first isolation structure which includes a first dielectric material and which extends into the semiconductor substrate at the common edge of the first and second N-type OD regions to separate the first and second NMOS transistors from each other; and a second isolation structure which includes a second dielectric material having a dielectric composition different from that of the first dielectric material and which extends into the semiconductor substrate at a common edge of the first and second P-type OD regions to separate the first and second PMOS transistors from each other.

In accordance with some embodiments of the present disclosure, the first and second dielectric materials are independently selected from silicon oxide, silicon nitride, silicon carbide, silicon oxycarbide, silicon oxynitride, silicon carbonitride, silicon oxycarbonitride, a high-k dielectric material, or combinations thereof.

In accordance with some embodiments of the present disclosure, the first isolation structure includes one or multiple layers of the first dielectric material.

In accordance with some embodiments of the present disclosure, the second isolation structure includes one or multiple layers of the second dielectric material.

In accordance with some embodiments of the present disclosure, the semiconductor device further includes an interlayer dielectric layer disposed on the semiconductor substrate, the first and second isolation structures penetrating through the interlayer dielectric layer to extend into the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first dummy poly gate and a second dummy poly gate respectively on a common edge of a first OD (oxide definition) region and a second OD region and a common edge of a third OD region and a fourth OD region of a semiconductor substrate;
    removing the first dummy poly gate and a portion of the semiconductor substrate below the first dummy poly gate to form a first trench extending into the semiconductor substrate to separate a first transistor and a second transistor which are adjacent to each other and which are disposed respectively in the first OD region and the second OD region;
    filling the first trench with a first dielectric material to form a first isolation structure to isolate the first transistor and the second transistor from each other;
    removing the second dummy poly gate and a portion of the semiconductor substrate below the second dummy poly gate to form a second trench extending into the semiconductor substrate to separate a third transistor and a fourth transistor which are adjacent to each other and which are disposed respectively in the third OD region and the fourth OD region; and
    filling the second trench with a second dielectric material to form a second isolation structure to isolate the third transistor and the fourth transistors from each other,
    wherein each of the first trench and the second trench is formed by an etching process in a manner such that each of the first trench and the second trench has a rectangular cross-sectional profile.

2. The method according to claim 1, wherein the first dielectric material and the second dielectric material are independently selected from silicon oxide, silicon nitride, silicon carbide, silicon oxycarbide, silicon oxynitride, silicon carbonitride, silicon oxycarbonitride, a high-k dielectric material, or combinations thereof.

3. The method according to claim 2, wherein the first isolation structure includes one or multiple layers of the first dielectric material.

4. The method according to claim 2, wherein the second isolation structure includes one or multiple layers of the second dielectric material.

5. The method according to claim 1, wherein forming the first trench and filling the first trench with the first dielectric material are performed prior to forming the second trench and filling the second trench with the second dielectric material.

6. The method according to claim 1, wherein forming the first trench is performed by a first etching process using a first patterned mask layer which has a first opening to expose the first dummy poly gate.

7. The method according to claim 6, wherein forming the second trench is performed by a second etching process using a second patterned mask layer which is different from the first patterned mask layer and which has a second opening to expose the second dummy poly gate.

8. The method according to claim 1, further comprising forming an interlayer dielectric layer on the semiconductor layer prior to removing the first dummy poly gate and the portion of the semiconductor substrate below the first dummy poly gate and prior to removing the second dummy poly gate and the portion of the semiconductor substrate below the second dummy poly gate, so that the first trench and the second trench thus formed penetrate through the interlayer dielectric layer to extend into the semiconductor substrate.

9. The method according to claim 1, wherein the first trench and the second trench are formed simultaneously.

10. The method according to claim 9, wherein formation of the first trench and the second trench includes:
forming a patterned mask layer having a first opening and a second opening to respectively expose the first dummy poly gate and the second dummy poly gate; and
simultaneously removing the first dummy poly gate, the portion of the semiconductor substrate below the first dummy poly gate, the second dummy poly gate, and the portion of the semiconductor substrate below the second dummy poly gate by an etching process through the first opening and the second opening.

11. The method according to claim 9, wherein the first dielectric material is the same as the second dielectric material, and the first isolation structure and the second isolation structure are formed simultaneously.

12. The method according to claim 1, wherein the first dielectric material has a dielectric composition different from a dielectric composition of the second dielectric material.

13. A method for manufacturing a semiconductor device, comprising:
forming a first dummy poly gate and a second dummy poly gate respectively on a common edge of a first OD (oxide definition) region and a second OD region and a common edge of a third OD region and a fourth OD region of a semiconductor substrate;
removing the first dummy poly gate and a portion of the semiconductor substrate below the first dummy poly gate to form a first trench extending into the semiconductor substrate to separate a first transistor and a second transistor which are adjacent to each other and which are disposed respectively in the first OD region and the second OD region;
filling the first trench with a first dielectric material to form a first isolation structure to isolate the first transistor and the second transistor from each other;
removing the second dummy poly gate and a portion of the semiconductor substrate below the second dummy poly gate to form a second trench extending into the semiconductor substrate to separate a third transistor and a fourth transistor which are adjacent to each other and which are disposed respectively in the third OD region and the fourth OD region; and filling the second trench with a second dielectric material to form a second isolation structure to isolate the third transistor and the fourth transistors from each other,
wherein
each of the first transistor and the second transistor includes a source/drain region, and the first trench is formed by an etching process in a manner such that the source/drain region of each of the first transistor and the second transistor is exposed to the first trench; and
each of the third transistor and the fourth transistor includes a source/drain region, and the second trench is formed by an etching process in a manner such that the source/drain region of each of the third transistor and the fourth transistor is exposed to the second trench.

14. The method according to claim 13, wherein the first isolation structure and the second isolation structure are formed simultaneously.

15. The method according to claim 14, wherein the first dielectric material is the same as the second dielectric material.

16. The method according to claim 13, wherein the first dielectric material has a dielectric composition different from a dielectric composition of the second dielectric material.

17. A method for manufacturing a semiconductor device, comprising:
forming a first dummy poly gate and a second dummy poly gate respectively on a common edge of a first OD (oxide definition) region and a second OD region and a common edge of a third OD region and a fourth OD region of a semiconductor substrate;
removing the first dummy poly gate and a portion of the semiconductor substrate below the first dummy poly gate to form a first trench extending into the semiconductor substrate to separate a first transistor and a second transistor which are adjacent to each other and which are disposed respectively in the first OD region and the second OD region;
filling the first trench with a first dielectric material to form a first isolation structure to isolate the first transistor and the second transistor from each other;
removing the second dummy poly gate and a portion of the semiconductor substrate below the second dummy poly gate to form a second trench extending into the semiconductor substrate to separate a third transistor and a fourth transistor which are adjacent to each other and which are disposed respectively in the third OD region and the fourth OD region; and
filling the second trench with a second dielectric material to form a second isolation structure to isolate the third transistor and the fourth transistors from each other,
wherein
each of the first trench and the second trench is formed by an etching process in a manner such that each of the first trench and the second trench has a rectangular cross-sectional profile having a width;
each of the first transistor and the second transistor includes a source/drain region, and the first trench is formed by an etching process in a manner such that the width of the first trench is equal to a distance between the source/drain region of the first transistor and the source/drain region of the second transistor; and
each of the third transistor and the fourth transistor includes a source/drain region, and the second trench is formed by an etching process in a manner such that the width of the second trench is equal to a distance between the source/drain region of the third transistor and the source/drain region of the fourth transistor.

18. The method according to claim 17, wherein the first trench and the second trench are formed simultaneously by:
forming a patterned mask layer having a first opening and a second opening to respectively expose the first dummy poly gate and the second dummy poly gate; and
simultaneously removing the first dummy poly gate, the portion of the semiconductor substrate below the first dummy poly gate, the second dummy poly gate, and the portion of the semiconductor substrate below the second dummy poly gate by an etching process through the first opening and the second opening.

19. The method according to claim 18, wherein the first dielectric material is the same as the second dielectric material, and the first isolation structure and the second isolation structure are formed simultaneously.

20. The method according to claim 17, wherein the first dielectric material has a dielectric composition different from a dielectric composition of the second dielectric material.

\* \* \* \* \*